United States Patent
Matsubara et al.

(10) Patent No.: US 8,498,504 B2
(45) Date of Patent: Jul. 30, 2013

(54) INTEGRATED OPTICAL TRANSMISSION BOARD AND OPTICAL MODULE

(75) Inventors: Takahiro Matsubara, Soraku-gun (JP); Keiko Oda, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 215 days.

(21) Appl. No.: 12/933,868

(22) PCT Filed: Mar. 27, 2009

(86) PCT No.: PCT/JP2009/056391
§ 371 (c)(1),
(2), (4) Date: Sep. 21, 2010

(87) PCT Pub. No.: WO2009/119850
PCT Pub. Date: Oct. 1, 2009

(65) Prior Publication Data
US 2011/0019960 A1    Jan. 27, 2011

(30) Foreign Application Priority Data

Mar. 27, 2008 (JP) .................. 2008-082437
Mar. 27, 2008 (JP) .................. 2008-085047
Jun. 27, 2008 (JP) .................. 2008-169113

(51) Int. Cl.
*G02B 6/125* (2006.01)
(52) U.S. Cl.
USPC ............. 385/14; 385/52; 385/92; 385/31; 385/49
(58) Field of Classification Search
USPC ............. 385/31, 33, 36, 42, 44, 47, 49, 50, 385/51, 92, 93, 94, 14, 129, 130, 131, 132, 385/52, 140
See application file for complete search history.

(56) References Cited

U.S. PATENT DOCUMENTS

| 4,245,884 | A * | 1/1981 | Magura et al. ............... 385/47 |
| 7,106,921 | B2 * | 9/2006 | Iwamori et al. .............. 385/14 |
| 7,346,242 | B2 * | 3/2008 | Morlion et al. .............. 385/52 |
| 7,551,811 | B2 * | 6/2009 | Aoki et al. .................. 385/14 |
| 2004/0156576 | A1 * | 8/2004 | Windover ..................... 385/14 |
| 2005/0025435 | A1 * | 2/2005 | Miyamae ...................... 385/88 |
| 2005/0100264 | A1 * | 5/2005 | Kim et al. .................... 385/14 |
| 2011/0019960 | A1 * | 1/2011 | Matsubara et al. ........... 385/14 |

FOREIGN PATENT DOCUMENTS

| JP | 2003-215372 | 7/2003 |
| JP | 2005-085844 | 3/2005 |
| JP | 2006-047764 | 2/2006 |
| JP | 2006-084766 | 3/2006 |
| JP | 2006-258835 | 9/2006 |
| JP | 2008-216794 | 9/2008 |

* cited by examiner

*Primary Examiner* — Brian Healy
(74) *Attorney, Agent, or Firm* — DLA Piper LLP (US)

(57) ABSTRACT

An integrated optical transmission board in accordance with one embodiment of the invention includes: a first optical transmission board having a first optical transmission line; a second optical transmission board having a second optical transmission line; and an optical coupling structure which is disposed between the first optical transmission board and the second optical transmission board and has a third optical transmission line for providing optical connection between the first optical transmission line and the second optical transmission line. The first optical transmission board further has a first engagement portion provided in an area thereof opposed to the optical coupling structure. The optical coupling structure further has a second engagement portion provided in an area thereof opposed to the first optical transmission board so as to make engagement with the first engagement portion.

10 Claims, 22 Drawing Sheets

INTEGRATED OPTICAL TRANSMISSION BOARD AND OPTICAL MODULE

CROSS-REFERENCE TO RELATED APPLICATIONS

This application is a national stage of international application No. PCT/JP2009/056391, filed Mar. 27, 2009 and claims the benefit of priority under 35 USC 119 to Japanese Patent Application No. 2008-082437, filed Mar. 27, 2008, Japanese Patent Application No. 2008-085047, filed Mar. 27, 2008 and Japanese Patent Application No. 2008-169113, filed Jun. 27, 2008, the entire contents of all of which are incorporated herein by reference.

TECHNICAL FIELD

The present invention relates to an integrated optical transmission board for connecting a plurality of semiconductor devices together by means of optical signals on a circuit board incorporated into electronic equipment, as well as to an optical module equipped with the integrated optical transmission board.

BACKGROUND ART

Recently, in keeping with studies of technologies to effect optical transmission on a circuit board whereby an electrical signal inputted and outputted at a semiconductor device is converted into an optical signal before transmission, active researches and development have been made on optical lines including an optical waveguide as a transmission line for the signals.

The use of an optical line enables not only the speeding up of signal transmission but also reduction in crosstalk noise between signals and achievement of ever-finer and ever-denser electrical lines.

In general, a semiconductor device is mounted on a surface of a package board made of a ceramic or plastic material. Hereafter a package board will be also referred to as "a semiconductor package".

A semiconductor package is mounted on and electrically connected to a circuit board. The circuit board has electrical lines adapted to input signals and output signals to and from the semiconductor package. The electrical lines allow input and output of electrical signals between the semiconductor package and the circuit board. Moreover, on a surface layer of the circuit board is formed an electrode pad facing to a metal pad of the semiconductor package. The electrode pad and the metal pad are connected together by a solder ball.

In an optical communication device disclosed in Japanese Unexamined Patent Publication JP-A 2003-215372, a semiconductor photo diode and a semiconductor light emitting device are mounted on a semiconductor package. The semiconductor package has a through optical transmission body for establishing optical connection between the top surface and the back surface of the semiconductor package. Meanwhile, a circuit board of this construction is formed with an optical waveguide, an end face of which is shaped into a 45 degree-angled turning mirror. A solder resist layer is formed on a surface layer of the optical waveguide. An aperture for optical path is formed around the turning mirror.

The semiconductor package and the circuit board are connected to each other by a solder ball for mutual electrical conduction.

Positioning of the semiconductor package and the circuit board is effected by exploiting a self-alignment effect exhibited by the solder ball, for example.

In this case, however, there arises a distance between the semiconductor package and the circuit board by the dimension of the solder ball, which results in optical leakage between the semiconductor package and the circuit board. This leads to the problem of occurrence of inter-channel cross talk and loss of optical transmission.

Furthermore, positioning and mounting based on the self-alignment effect are techniques that depend heavily on the proficiency in operation of a skilled and trained worker. It is therefore quite difficult to adopt such a technique as a mounting method for electronic equipment that is required to be mass-produced at low cost.

DISCLOSURE OF INVENTION

An object of the invention is to provide an integrated optical transmission board and an optical module in which optical leakage between two boards can be reduced to suppress occurrence of inter-channel cross talk and optical transmission loss and thus optical connection between the boards can be established readily with lower loss.

An integrated optical transmission board in accordance with one embodiment of the invention comprises: a first optical transmission board having a first optical transmission line; a second optical transmission board having a second optical transmission line; and an optical coupling structure which is disposed between the first optical transmission board and the second optical transmission board and has a third optical transmission line for providing optical connection between the first optical transmission line and the second optical transmission line. The first optical transmission board further has a first engagement portion provided in an area thereof opposed to the optical coupling structure. The optical coupling structure further has a second engagement portion provided in an area thereof opposed to the first optical transmission board so as to make engagement with the first engagement portion.

An optical module in accordance with another embodiment of the invention comprises: the above-described integrated optical transmission board; and an optical semiconductor device which is optically connected to the second optical transmission line and is mounted on the second optical transmission board so as to face the optical coupling structure through the second optical transmission board.

An optical transmission structure in accordance with still another embodiment of the invention comprises: an optical transmission board having an optical transmission line for optical transmission; and an optical coupling structure which is disposed on the optical transmission board and has another optical transmission line to be optically connected to the optical transmission line and an engagement portion for engagement with another member.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
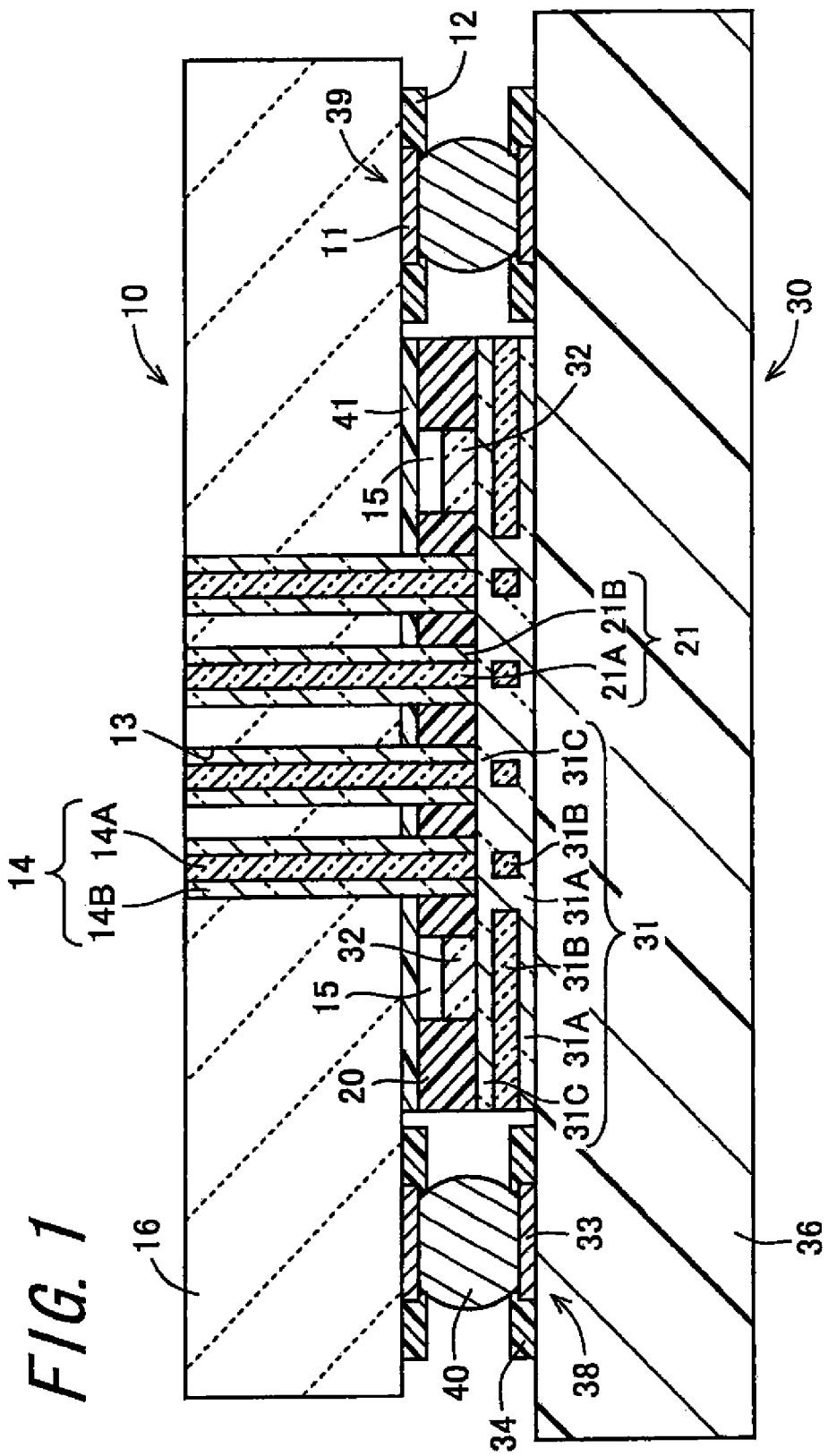
FIG. 1 is a sectional view of an integrated optical transmission board in accordance with a first embodiment of the invention.

Now referring to the drawings, preferred embodiments of the invention are described below.

Hereinafter, an integrated optical transmission board in accordance with one embodiment of the invention will be described with reference to the drawings.

Figure 2:
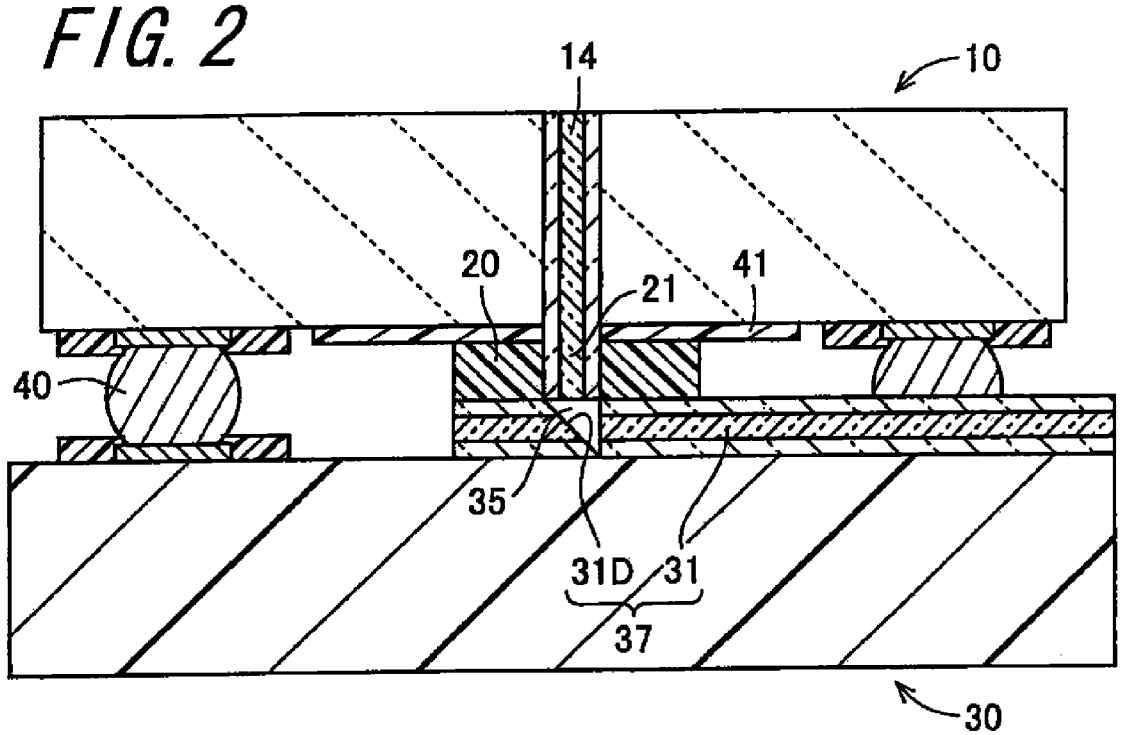
FIG. 2 is a sectional view of the integrated optical transmission board as viewed in a direction perpendicular to FIG. 1.
Figure 3:
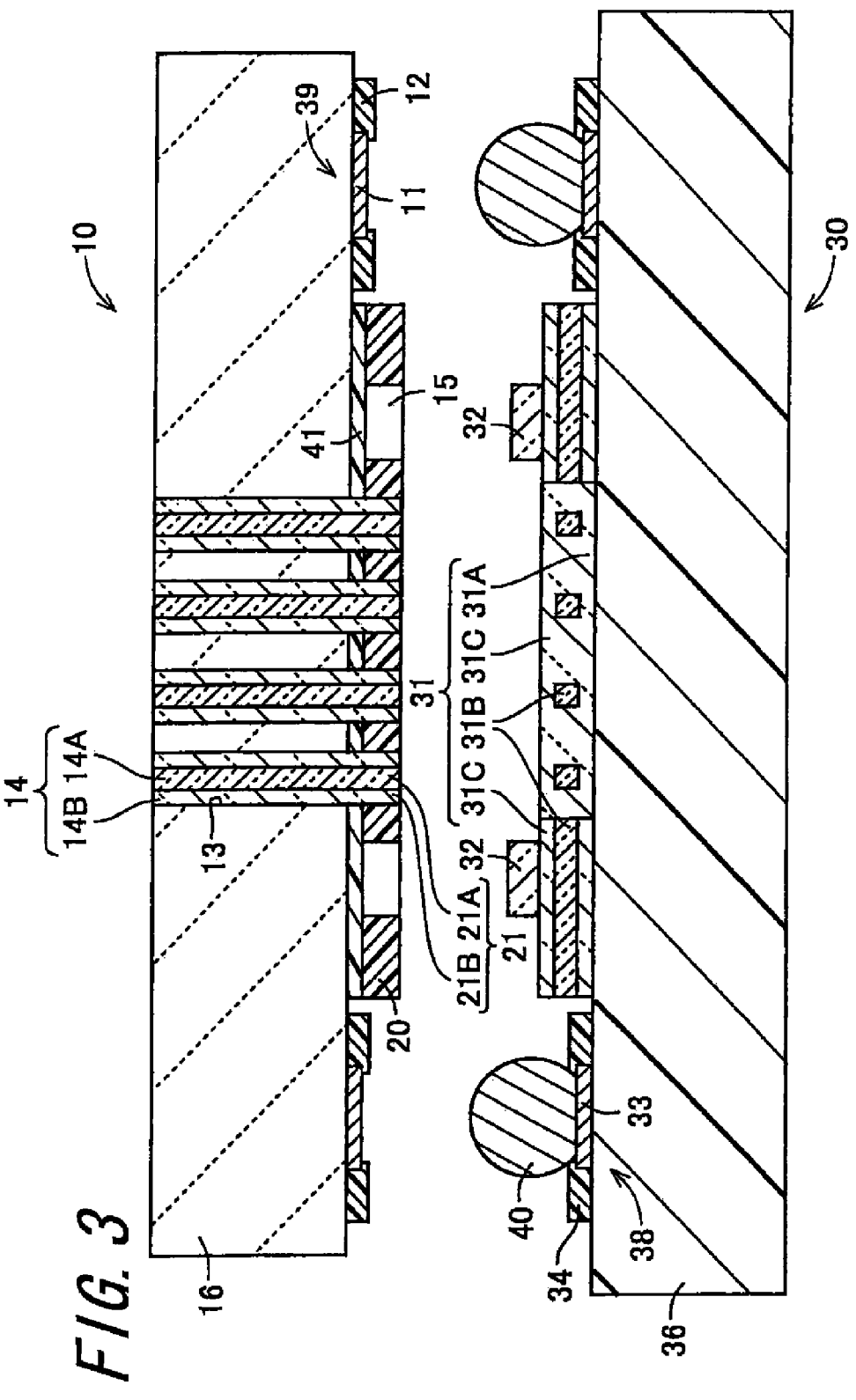
FIG. 3 is an exploded sectional view of the integrated optical transmission board as viewed in the same direction as FIG. 1.

The integrated optical transmission board in accordance with a first embodiment of the invention as shown in FIGS. 1 to 3 is used in a case where, for example, a plurality of semiconductor devices are connected together by means of optical signals on a circuit board incorporated into electronic equipment. In this case, the integrated optical transmission board is used with connections to a semiconductor element, optical to electrical, electrical to optical conversion devices, and peripheral circuitry. However, in order to simplify the following explanations, those components are not represented graphically in FIGS. 1 to 3.

The integrated optical transmission board is constructed by stacking a circuit board 30 and a semiconductor package 10, and the circuit board 30 and the semiconductor package 10 are optically connected together by an optical coupling structure 20. Note that, in FIGS. 1 to 3, the circuit board 30 is treated as a first optical transmission board, and the semiconductor package 10 is treated as a second optical transmission board.

The circuit board 30 comprises a first substrate 36 and a first optical transmission line 37 for optical transmission. As shown in FIGS. 1 to 3, the first optical transmission line 37 includes an optical waveguide 31 and a turning mirror 31D having a turning face inclined with respect to the direction of the optical axis of the optical waveguide 31. The optical waveguide 31 is provided on one main surface of the first substrate 36 so as to extend in parallel with the main surface. The turning mirror 31D is designed as, for example, a turning face inclined at 45 degrees with respect to the optical axis direction. The turning face allows light traveling through the optical waveguide 31 to make a 90-degree turn to change the direction of its optical path from there to the direction of the normal to the main surface of the first substrate 36.

For example, the turning mirror 31D is constructed by cutting the optical waveguide 31 with a dicing blade having a cross section forming an angle of approximately 45 degrees so as to be perpendicular to the main surface of the first substrate 36, followed by coating the resultant approximately 45-degree inclined surface with a metal material such for example as gold, silver, copper, aluminum, nickel, or the like, or with a thin film of such a metal material.

The optical waveguide 31 is composed of a lower cladding 31A, a core 31B, and upper and lateral claddings 31C that are designed in a coaxial structure. Since the core 31B is a few or more percent higher in refractive index than the cladding 31A and the cladding 31C, an optical signal can be transmitted while being confined within the core with consequent loss reduction.

Where the specific dimensions of the optical waveguide 31 are concerned, for example, the thickness of the lower cladding 31A falls within a range of 15 µm to 2.5 µm, the size of the cross section of the core 31B falls within a range of 35 µm square to 100 µm square, and the thickness of the upper cladding 31C falls within a range of 15 µm to 25 µm.

The semiconductor package 10 comprises a second substrate 16 and a second optical transmission line 14 for optical transmission. As shown in FIGS. 1 to 3, the second optical transmission line 14 passes through the second substrate 16 in a thickness direction thereof.

The optical coupling structure 20 is interposed between the circuit board 30 and the semiconductor package 10. The optical coupling structure 20 is constructed for example of a plate-like member which is approximately 0.3 to 0.5 mm thick, 6 mm wide, and 3 mm deep. In a midportion of the optical coupling structure 20 corresponding to the second optical transmission line 14 formed in the semiconductor package 10 and the first optical transmission line 3731 of the circuit board 30, there is formed a third optical transmission line 21 passing through the optical coupling structure for effecting optical transmission in a thickness direction thereof.

The third optical transmission line 21, which is so provided as to pass through the optical coupling structure 20 in a thickness direction thereof, is made of a transparent material and composed of a cladding 21B and a core 21A just as is the case with optical fiber. The third optical transmission line 21 provides optical connection between the top surface and the back surface of the optical coupling structure 20. The third optical transmission line 21 is circular in cross section parallel to the main surface.

The third optical transmission line 21 is optically connected to the second optical transmission line 14 of the semiconductor package 10 on a main surface of the optical coupling structure 20 that is opposed to the semiconductor package 10. Moreover, the third optical transmission line 21 is optically connected to the first optical transmission line 37 of the circuit board 30 on a main surface of the optical coupling structure 20 that is opposed to the circuit board 30. In FIGS. 1 to 3, the number of the third optical transmission lines 21 is the same as the number of the second optical transmission line 14 as well as the first optical transmission line 37.

The optical coupling structure 20 is provided to reduce optical leakage occurring between the first optical transmission line 37 and the second optical transmission line 14 provided between the circuit board 30 and the semiconductor package 10, as well as to suppress occurrence of inter-channel cross talk and optical transmission loss.

In order to suppress occurrence of optical transmission loss even more positively, it is preferable that resin is charged into a space 35 surrounded by the second optical transmission line 14 disposed in the semiconductor package 10 and the first optical transmission line 37 (to be specific, a space surrounded by the second optical transmission line 14, the turning mirror 31D, and the optical waveguide 31). This makes it possible to suppress optical transmission loss between the third optical transmission line 21 and the first optical transmission line 37. As said resin, resin which is similar in refractive index to the core 31B of the optical waveguide 31 is desirable for use.

The optical coupling structure 20 is made of a material having shading properties, except for the area formed with the third optical transmission line 21. In this case, "possession of shading properties" means at least the capability of shading external light to prevent it from reaching the second optical transmission line 14. For example, it is possible to use epoxy resin colored with pigments exhibiting shading properties.

The optical coupling structure 20 can also be formed by means of photolithography. In this case, photosensitive resin with a necessary thickness is applied to the second substrate 16, and patterning is performed thereon through the process of light exposure and development. In this way, aside from the part constituting the optical coupling structure 20, excess photosensitive resin is removed by development. Moreover, when a second engagement portion is designed as a through hole passing through the optical coupling structure 20, in a like manner, the through hole can be made by development. For example, when the optical coupling structure 20 is made of the same material as that constituting the cladding of the optical waveguide 31, in constructing the second optical transmission line 14, only the core 14A is formed, so that optical transmission can be achieved by exploiting the effect of light guiding by refraction with the same refractive index difference as in the optical waveguide 31.

The circuit board 30 has a projection 32 acting as a first engagement portion formed in an area thereof opposed to the optical coupling structure 20. In the integrated optical transmission board shown in FIGS. 1 to 3, the area opposed to the optical coupling structure 20 refers to the upper part of the optical waveguide 31.

Examples of shape of the projection 32 include a columnar shape, a forwardly tapered shape (tapered structure), and an inversely tapered shape (club-shaped structure). The height of the projection 32 falls within a range of 150 μm to 300 μm, for example. Moreover, when the projection 32 has a circular cross-sectional profile, the diameter of the projection 32 falls within a range of 100 μm to 900 μm, for example.

The projection 32 engages in a concavity 15 provided as the second engagement portion in the optical coupling structure 20 as will hereafter be described. In other words, the projection 32 is inserted into the concavity 15 in contact with the inner surface of the concavity 15, for effecting positioning of the circuit board 30 and the optical coupling structure 20 to establish optical connection between the circuit board 30 and the optical coupling structure 20.

It is preferable that the projection 32 is located on the first optical transmission line 37 so as to face the second substrate 16. In the case shown in FIG. 3, the projection 32 is provided on the upper cladding 31C of the optical waveguide 31. When disposed on the first optical transmission line, the projection 32 can be brought nearer to the second substrate 16 of the semiconductor package 10 by an amount equivalent to the thickness of the first optical transmission line.

Moreover, since the concavity 15 and the projection 32 are disposed in the vicinity of the part of optical connection between the first optical transmission line 37 and the third optical transmission line 21, it follows that the first optical transmission line 37 is in proper alignment with the second optical transmission line 14 with high accuracy. As a result, optical leakage between the optical transmission boards can be prevented, and occurrence of inter-channel cross talk and optical transmission loss can be suppressed.

A method of forming the projection 32 will be presented hereinbelow.

To begin with, photosensitive resin is applied in a thickness of 150 to 300 μm by means of spin coating, and it is pre-baked so as to be primarily cured. Then, the photosensitive resin coating is exposed to light with use of a photomask, is developed, and is post-baked, whereupon the projection 32 is formed. A so-called indelible resist is desirable for use as said photosensitive resin. Herein the indelible resist refers to a resist which remains unremoved for use even after the completion of the process of photolithography. Examples of the indelible resist include epoxy resin.

The circuit board 30 is manufactured by the following method, for example.

The surface of the first substrate 36 is subjected to material application, pre-baking, light exposure, development, and post-baking repeatedly to thereby form the lower cladding 31A.

The upper part of the lower cladding 31A is subjected to material application, pre-baking, light exposure, development, and post-baking repeatedly to thereby form the core 31B.

The lateral surface and upper part of the core 31B are subjected to material application, pre-baking, light exposure, development, and post-baking repeatedly to thereby form the upper and lateral claddings 31C successively.

Subsequently, the resultant optical waveguide 31 is cut perpendicularly to the first substrate 36 by using a dicing blade having an end face forming an angle of approximately 45 degrees to thereby form the turning mirror 31D. Then, as a reflection coating, 2000 Å-thick Au is vapor-deposited on the inclined surface of the turning mirror 31D. At this time, in order to avoid Au vapor deposition to the vertical surface, a mask has to be used, or care needs to be taken on board placement so that the vertical surface is concealed from a source of vapor deposition during vapor deposition. Alternatively, for example, following the completion of vapor deposition, cutting operation is performed once again to obtain a mint-state vertical surface. In such a manner, care needs to be taken to see that no reflection coating will be formed on the vertical surface.

In a manner similar to the above-described projection 32-forming method, photosensitive resin is applied in a thickness of 150 to 300 μm by means of spin coating, and it is pre-baked so as to be primarily cured.

Then, the photosensitive resin is exposed to light with use of a photomask, is developed, and is post-baked, whereupon the projection 32 is formed.

In this way, the circuit board 30 can be formed.

Figure 4:
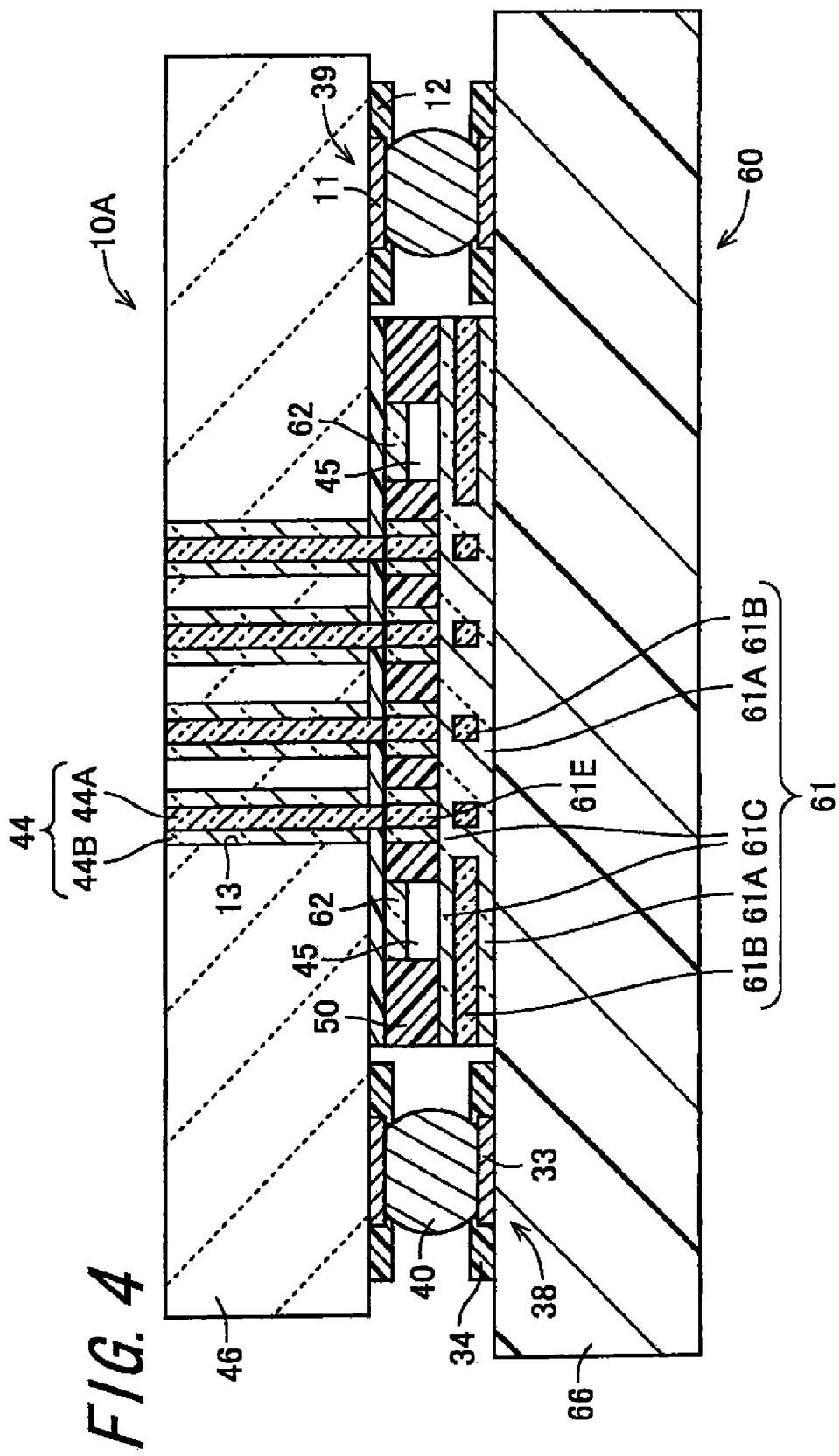
FIG. 4 is a sectional view showing the structure of the integrated optical transmission board in accordance with a second embodiment of the invention.
Figure 5:
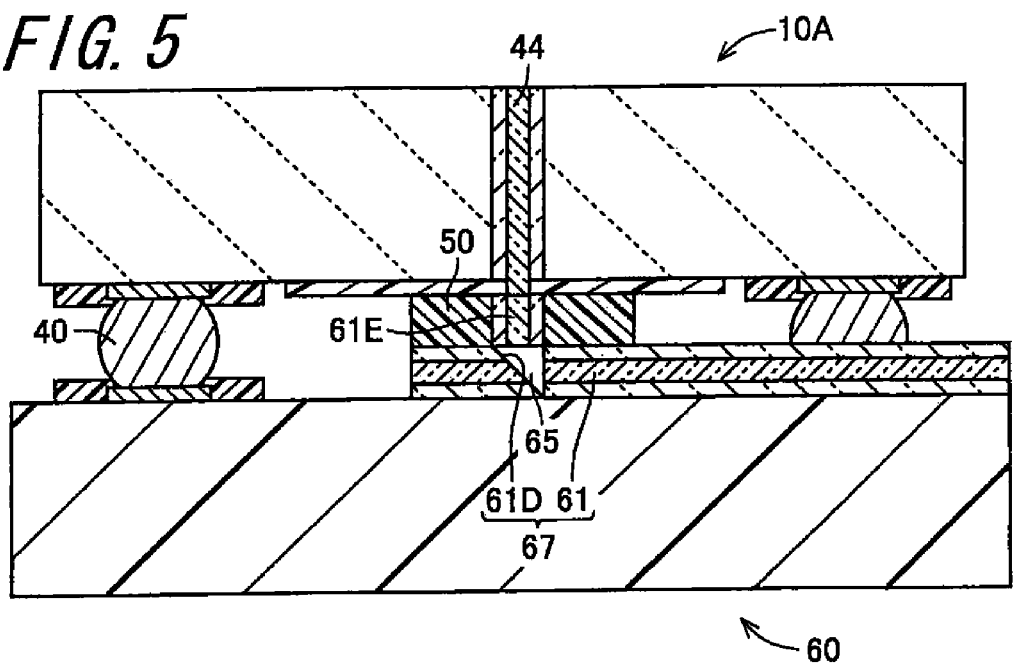
FIG. 5 is a sectional view of the integrated optical transmission board as viewed in a direction perpendicular to FIG. 4.
Figure 6:
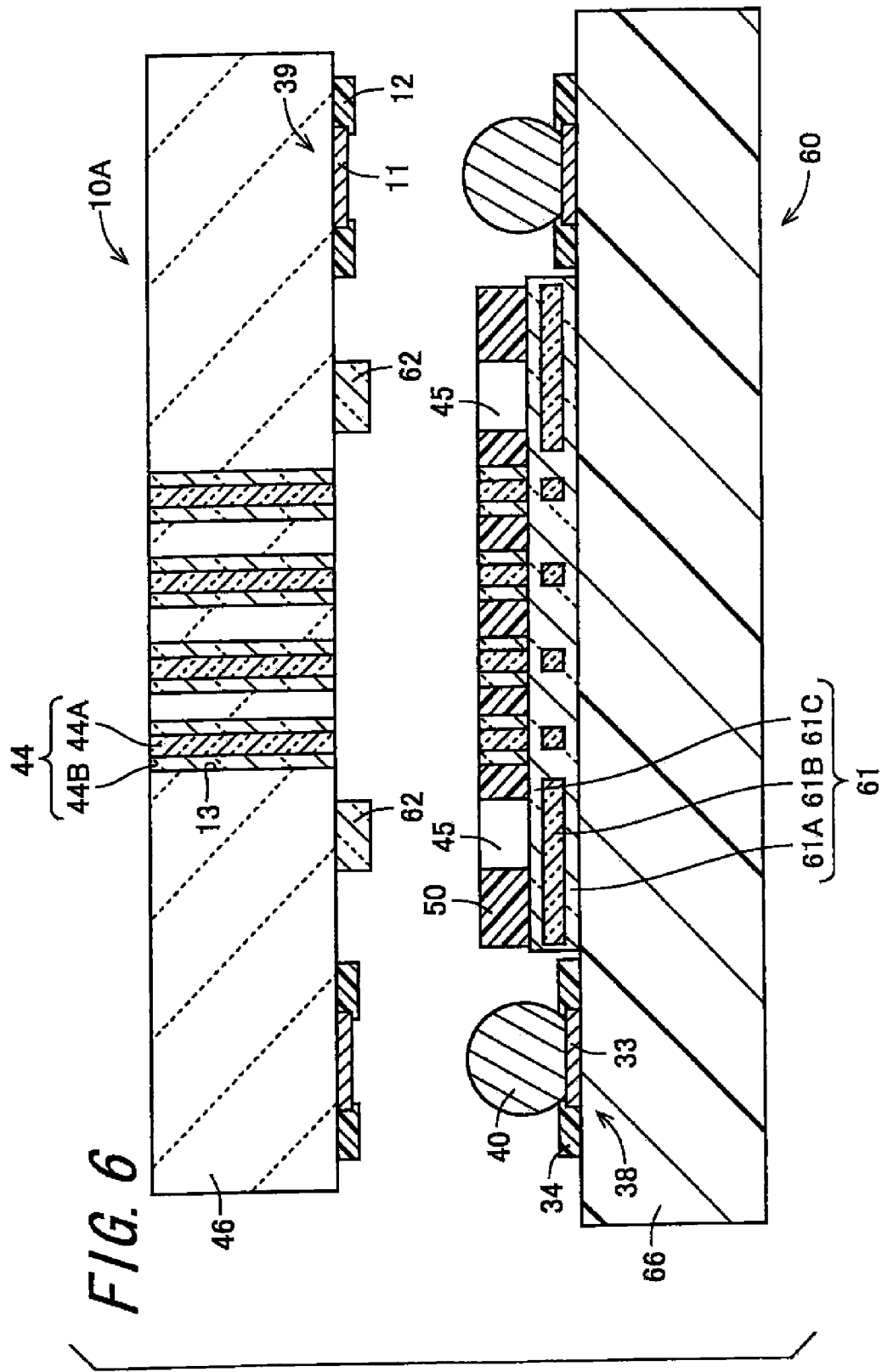
FIG. 6 is an exploded sectional view of the integrated optical transmission board as viewed in the same direction as FIG. 4.

The second and third optical transmission lines 14 and 21 shown in FIGS. 1 to 3 are so provided as to pass through the second substrate 16 and the optical coupling structure 20 in the thickness direction thereof. This allows light to propagate from the top surface to the back surface of the substrate. The diameter of each of the second and third optical transmission lines 14 and 21 falls within a range of 100 μm to 200 μm, for example. The diameter of the core 14A falls within a range of 35 μm to 100 μm, for example. Note that, in a case as shown in FIGS. 4 to 6 as will hereafter be described, a second optical transmission line 67 may be provided on a second substrate 66.

The second optical transmission line 14 shown in FIGS. 1 to 3 is composed of a cladding 14B and the core 14A. The second optical transmission line 14 is formed by charging a transparent material into a through hole 13 created so as to pass through the second substrate 16 and the optical coupling structure 20 in the thickness direction thereof. The second optical transmission line 14 has a circular cross section. Note that the cross section is parallel to the main surface of the first substrate 36.

The optical coupling structure 20 has the concavity 15. In the vicinity of the outer periphery of the second optical transmission line 14 provided in the optical coupling structure 20, there are provided a plurality of concavities 15 each corresponding to the projection 32. For example, the diameter of the concavity 15 and the pitch of the concavities 15 are 0.7 mm and 4.3 mm, respectively.

In this construction, with the projection 32 inserted in the concavity 15 of the optical coupling structure 20, optical connection can be established between the second optical transmission line 14 and the first optical transmission line 37.

While the concavity 15 can be formed by a method of creating a hole in the optical coupling structure 20 with use of a precise drill or laser, the concavity formation method is not limited thereto.

Since the projection 32 and the concavity 15 engage each other with great precision, it is possible to prevent a misalignment from occurring between the semiconductor package 10 and the circuit board 30 in respect of their horizontal optical connection.

Moreover, the semiconductor package 10 and the circuit board 30 are so arranged that the first substrate 36-facing surface of the optical coupling structure 20 makes intimate contact with the opposed main surfaces of the semiconductor package 10 and the circuit board 30 under the condition that the projection 32 is inserted in the concavity 15 of the optical coupling structure 20. This makes it possible to maintain a vertical gap between the semiconductor package 10 and the circuit board 30 with accuracy, as well as to suppress optical leakage.

In the case where the concavity 15 and the projection 32 engage each other, the opening dimension of the concavity 15 may be made larger than the width of the projection 32. In this case, a gap is created between the concavity 15 and the projection 32, wherefore the engagement between the concavity and the projection can be effected smoothly while bringing the inner wall surface of the concavity 15 into contact with the outer wall surface of the projection 32. For example, when the concavity and the projection each have a circular cross-sectional profile, the diameter of the concavity may be set to be 3 to 10 μm larger than the diameter of the projection.

While it is essential only that the opening cross-section of the projection 32 and that of the concavity 15 have the same shape, the opening cross-sections should preferably be circular in shape. By imparting a circular cross-sectional profile, it is possible to facilitate the engagement between the projection and the concavity. Note that the cross section is parallel to the main surface of the first substrate 36.

Examples of shapes of the projection 32 and the concavity 15 include a columnar shape, a forwardly tapered shape (tapered shape), and an inversely tapered shape (club shape).

The semiconductor package 10 is manufactured by the following method, for example.

The second substrate 16 and a member constituting the optical coupling structure are positioned so that the through hole of the second substrate 16 and the through hole provided in the member constituting the optical coupling structure communicate with each other to form the through hole 13. Then, the second substrate 16 and the member constituting the optical coupling structure are fixedly bonded together. For example, a wire which is fitted precisely in the through hole 13 of the member constituting the optical coupling structure is used for positioning operation. The wire is run across the through holes 13 arranged in an array and, following the application of an adhesive 41, the member constituting the optical coupling structure is cured on the second substrate 16, whereafter the wire is pulled out. In this way, the positioning of the through holes can be achieved with accuracy.

Next, a transparent material, for example, transparent epoxy resin having a refractive index of approximately 1.5 is charged evenly into the through hole 13 as a cladding, followed by causing it to be cured under application of heat.

Next, a through hole is created at the center of the cladding by using a precise drill or laser to form a core portion. Then, a material, such as transparent epoxy resin, which is a few or more percent higher in specific refractive index than the cladding is charged into the through hole as a core, followed by causing it to be cured under application of heat. In this way, the third optical transmission line 21 is formed continuously and integrally with the second optical transmission line 14.

Thus, the semiconductor package 10 can be formed.

Although, in the above-described manufacturing method, the coaxial structure of the second optical transmission line 14 is constructed by using two types of resin, the second optical transmission line 14 and the third optical transmission line 21 can also be formed by inserting a component having a core and a cladding previously designed in a coaxial structure. For example, the second optical transmission line 14 and the third optical transmission line 21 can be formed by processing a commercially available fiber-optic member into a required length in advance, inserting the processed fiber-optic member into the through hole 13, and fixing it in place by an adhesive.

The semiconductor package 10 and the circuit board 30, while being optically connected together through the optical coupling structure 20 as described hereinabove, are electrically connected together by establishing connection between the opposed connection pads of the semiconductor package and the circuit board through a plurality of mounting portions 40 such as solder balls or solder bumps.

The solder ball or solder paste contains a flux composed predominantly of an organic solvent, and the flux is diffused under application of heat. Therefore, the flux tends to adhere onto the opposed surfaces of the circuit board 30 and the semiconductor package 10. The flux is generally clear and colorless, but turns whitish through a reaction or turns brownish with time. That is, the adhesion of the flux to the exposed surface of the optical transmission line could give rise to optical loss, which makes it difficult to achieve proper optical connection between the optical transmission boards.

In this regard, according to: the integrated optical transmission board of the present embodiment, since the optical coupling structure 20 provided in the semiconductor package 10 is so disposed as to make the gap between the semiconductor package 10 and the circuit board 30 smaller, it is possible to reduce the possibility that the flux will cover the exposed surface of the first optical transmission line 37 and the exposed surface of the second optical transmission line 14 as well, and thereby prevent deterioration in optical transmission performance.

The mounting portions 40 are so arranged as to surround the outer periphery of the optical coupling structure 20, for allowing the semiconductor package 10 and the circuit board 30 to be directly and fixedly bonded to each other.

The circuit board 30 and the semiconductor package 10 are provided with electrical line layers 38 and 39, respectively, such as connection pads, to make connection with the mounting portion 40. In the circuit board 30, the electrical line layer 38 is provided on the main surface of the first substrate 36 opposed to the semiconductor package 10, and is composed of a metal layer 33 made of a metal material and a solder resist 34 which covers the periphery of the metal layer 33. On the other hand, in the semiconductor package 10, the electrical line layer 39 is provided on the main surface of the second substrate 16 opposed to the circuit board 30, and is composed of a metal layer 11 made of a metal material and a solder resist 12 which covers the periphery of the metal layer 11.

The integrated optical transmission board is formed by joining together the semiconductor package 10 and the circuit board 30 thus far described through the following procedural steps.

To begin with, the solder balls 40 having a desired diameter are attached to the circuit board 30 under application of heat. At this time, a solder paste is printed to solder pads with use of a mask bearing holes of the same pitch as that of the solder pads, and solder balls are arranged thereon, followed by heating them up to a temperature higher than or equal to the melting temperature of the solder ball.

Next, the circuit board 30 and the semiconductor package 10 are stacked on top of each other, with the optical coupling structure 20 interposed therebetween, and the concavity 15 engages in the projection 32. At this time, in the gap between them, a very small amount of a refractive-index matching agent is added. As the refractive-index matching agent, silicone resin, epoxy resin, acrylic resin, or the like having a refractive index close to that of the core of the second optical transmission line 14 is desirable for use.

The integrated board composed of the circuit board 30 and the semiconductor package 10 is heated in a reflow furnace or the like. At a temperature below the melting point of the solder ball, a gap still exists between the optical coupling structure 20 provided in the semiconductor package 10 and the upper part of the first optical transmission line 37 of the circuit board 30. Then, as the ambient temperature rises to a level higher than or equal to the melting point of the solder ball, the solder ball starts to melt, with the consequence that the semiconductor package 10 sinks under its own weight. Therefore, with precise engagement between the concavity 15 and the projection 32, the gap between the optical coupling structure 20 provided in the semiconductor package 10 and the upper part of the first optical transmission line 37 of the circuit board 30 becomes smaller. After that, as the ambient temperature decreases, the solder ball is cured and shrinks, thereby causing the semiconductor package 10 and the circuit board 30 to be pulled towards each other with consequent contact between the first optical transmission line 37 and the optical coupling structure 20. In this way, optical connection ranging from the second optical transmission line 14 to the optical waveguide 31 via the turning mirror 31D is completed. Note that, when the assembly is heated in a reflow furnace or the like, a load may be placed at the side of the semiconductor package 10. This is effective as a method to reduce the size of the gap in the part of optical connection between the first optical transmission line 37 and the third optical transmission line 21.

The integrated optical transmission board in accordance with a second embodiment of the invention as shown in FIGS. 4 to 6 is constructed by stacking a semiconductor package 10A acting as a first optical transmission board and a circuit board 60 acting as a second optical transmission board for mutual optical connection.

In the explanation of the integrated optical transmission board of the preceding first embodiment, the circuit board 30 is described acting as the first optical transmission board and the semiconductor package 10 is described acting as the second optical transmission board. On the other hand, in the following explanation of the integrated optical transmission board of the second embodiment, the semiconductor package 10A is described acting as the first optical transmission board and the circuit board 60 is described acting as the second optical transmission board. Note that, in the integrated optical transmission board implemented by way of one embodiment of the invention, the first optical transmission board can be any of the semiconductor package and the circuit board, and so can the second optical transmission board.

The semiconductor package 10A shown in FIGS. 4 to 6 comprises a first substrate 46 and a first optical transmission line 44. Although the first optical transmission line 44 is so provided as to pass through the first substrate 46 in a thickness direction thereof, it may be formed on the first substrate 46.

The first optical transmission line 44 is, like the previously-described second optical transmission line 14 shown in FIGS. 1 to 3, composed of a cladding 44B and a core 44A.

The first substrate 46 has a plurality of projections 62 acting as a first engagement portion formed on a main surface thereof. The projection 62 is inserted into a concavity 45 acting as a second engagement portion formed in an optical coupling structure 50 as will hereafter be described, for effecting positioning of the semiconductor package 10A and the optical coupling structure 50.

The projection 62 is similar to the projection 32 of the integrated optical transmission board of the preceding first embodiment in terms of shape and manufacturing method, and will therefore not be described in detail.

The circuit board 60 comprises a second substrate 66 and a second optical transmission line 67. The second optical transmission line 67 is provided on the second substrate 66.

In the case shown in FIGS. 4 to 6, the second optical transmission line 67 includes an optical waveguide 61 provided on one main surface of the second substrate 66 so as to extend in parallel with the main surface, and a turning mirror 61D having a turning face inclined with respect to the direction of the optical axis of the optical waveguide 61. The optical coupling structure 50 provided in the circuit board 60 has a third optical transmission line 61E provided along a thickness direction thereof. In addition, the optical coupling structure 50 has the concavity 45. The optical waveguide 61 is composed of a lower cladding portion 61A, a core 61B, and an upper cladding portion 61C. Moreover, the third optical transmission line 61E is composed of a centrally-placed core and a cladding surrounding the core.

The optical waveguide 61 and the turning mirror 61D are similar to the optical waveguide 31 and the turning mirror 31D, respectively, of the integrated optical transmission board of the first embodiment, and will therefore not be described in detail.

In FIGS. 4 to 6, the optical coupling structure 50 is provided on the optical waveguide 61. This makes it possible to bring the circuit board 60 nearer to the semiconductor package 10A by an amount equivalent to the thickness of the optical waveguide 61, and thereby achieve satisfactory engagement between the projection 62 and the concavity 45.

The optical coupling structure 50 and the concavity 45 of the optical coupling structure 50 are similar to the optical coupling structure 20 and the concavity 15, respectively, of the integrated optical transmission board of the preceding first embodiment of the invention in terms of manufacturing method, and will therefore not be described in detail.

As exemplary of the concavity 45 shown in FIGS. 4 to 6, there is illustrated a concavity whose bottom surface coincides with the top surface of the optical waveguide 61 adjacent to the optical coupling structure 50. Alternatively, the concavity 45 can be a concavity passing through the optical coupling structure 50 and the optical waveguide 61, with its bottom surface coinciding with the top surface of the second substrate 66, or a concavity passing through the optical coupling structure 50, with its bottom surface lying within the optical waveguide 61. In this case, the concavity can be obtained by, at the time of patterning for the lower cladding, the upper cladding, and/or the core of the optical waveguide 61 located immediately below the through hole constituting the concavity, creating a hole in the claddings, followed by bringing the hole into alignment with the through hole created in the optical coupling structure.

In this way, with the provision of the continuous concavity 45 from the optical coupling structure 50 to the optical waveguide 61, the projection 62 acting as the first engagement portion can be made larger, wherefore the engagement between the concavity and the projection can be achieved even more satisfactorily.

Figure 7:
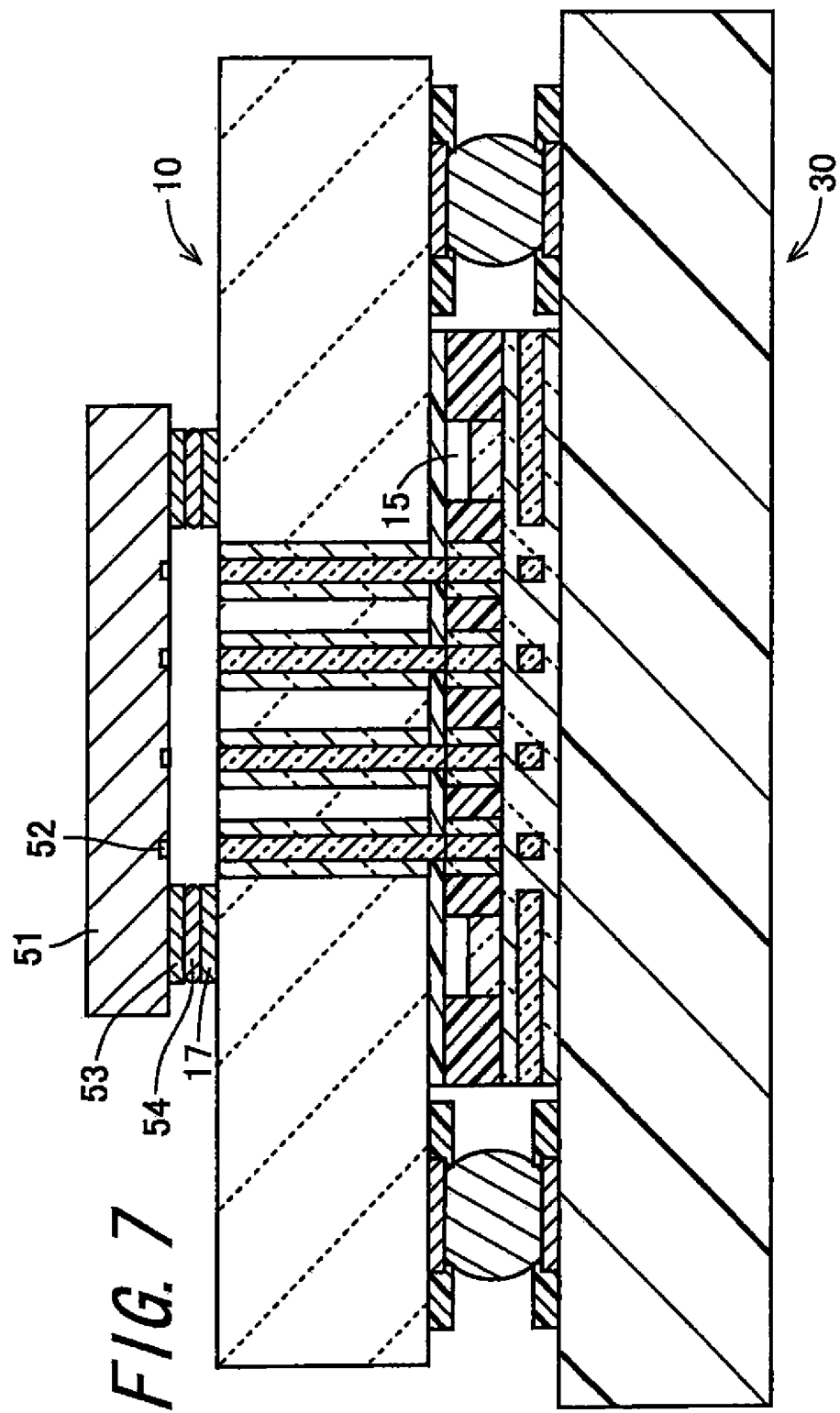
FIG. 7 is a sectional view showing the structure of an optical module.

FIG. 7 is a sectional view showing the structure of an optical module equipped with the integrated optical transmission board shown in FIG. 1.

In FIG. 7, the optical module is constructed by mounting, as an optical semiconductor device, a semiconductor laser array 51 on the semiconductor package 10 of the integrated optical transmission board shown in FIG. 1. The semiconductor laser array 51 is mounted in a face-down manner so that its light-emitting point 52 can be opposed to the second optical transmission line 14 formed in the semiconductor package 10. In FIG. 7, the semiconductor laser array 51 incorporates a vertical cavity surface emitting laser (VCSEL). A surface electrode pad 53 of the semiconductor laser array 51 is formed with a gold bump 54, and the gold bump 54 is ultrasonically bonded to an electrode pad 17 formed on a surface of the semiconductor package 10 under pressure, whereupon the mounting of the semiconductor laser array 51 is completed.

Note that, in general, refractive index matching is performed on a gap between the semiconductor laser array 51 and the semiconductor package 10 by using transparent resin. However, the graphical representation thereof will be omitted in FIG. 7. Moreover, although, in FIG. 7, there is shown the case where a semiconductor laser which is a light source for emitting light is used as a semiconductor device and light is caused to propagate through the semiconductor package 10, the optical coupling structure 20, and the circuit board 30 successively in the order named, the construction may also be so designed that a photodiode for receiving optical signals is used as a semiconductor device and light is caused to propagate through the circuit board 30, the optical coupling structure 20, and the semiconductor package 10 successively in the order named.

Figure 8:
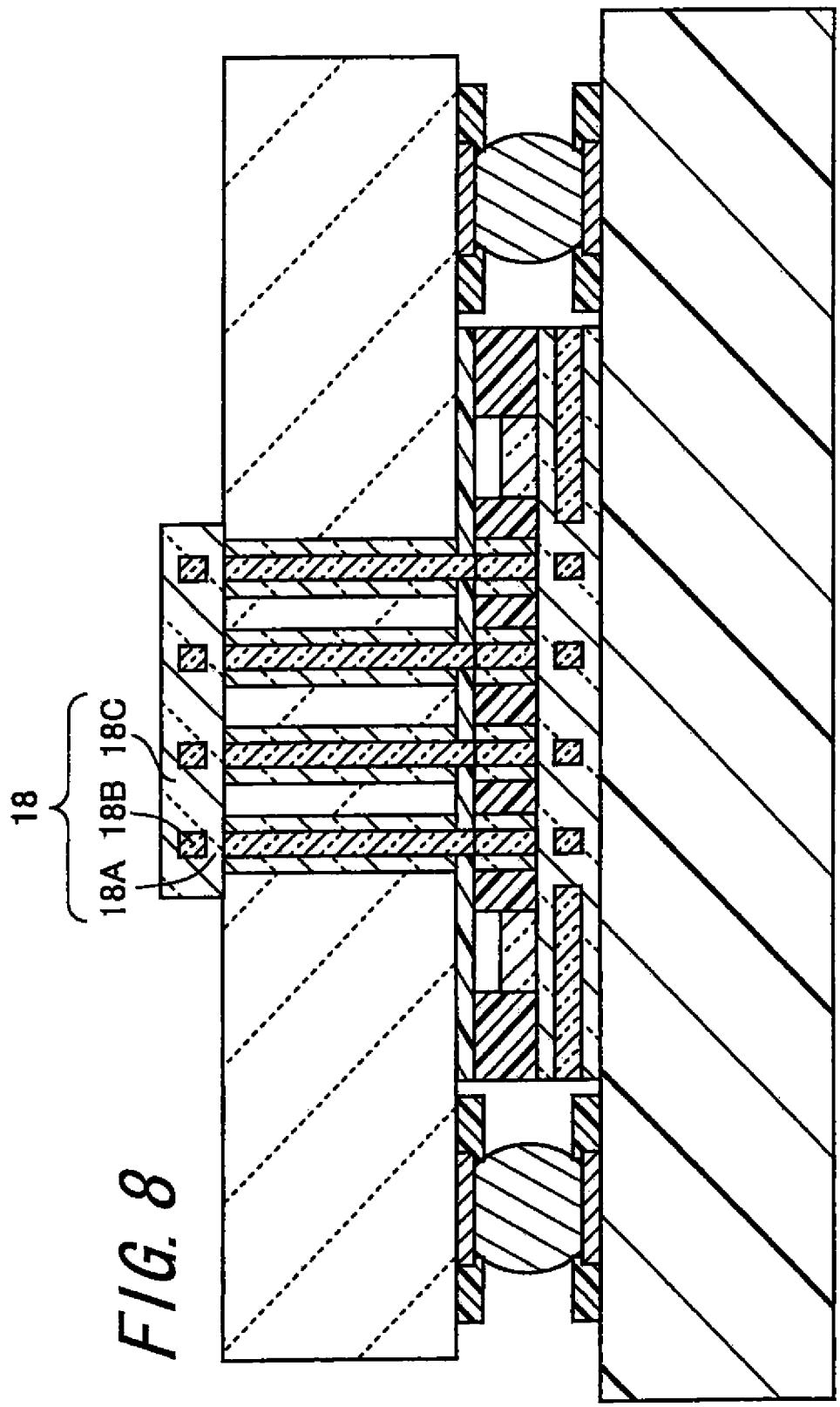
FIG. 8 is a sectional view showing a different structure of the integrated optical transmission board in accordance with the first embodiment of the invention, from that of the integrated optical transmission board shown in FIG. 1.
Figure 9:
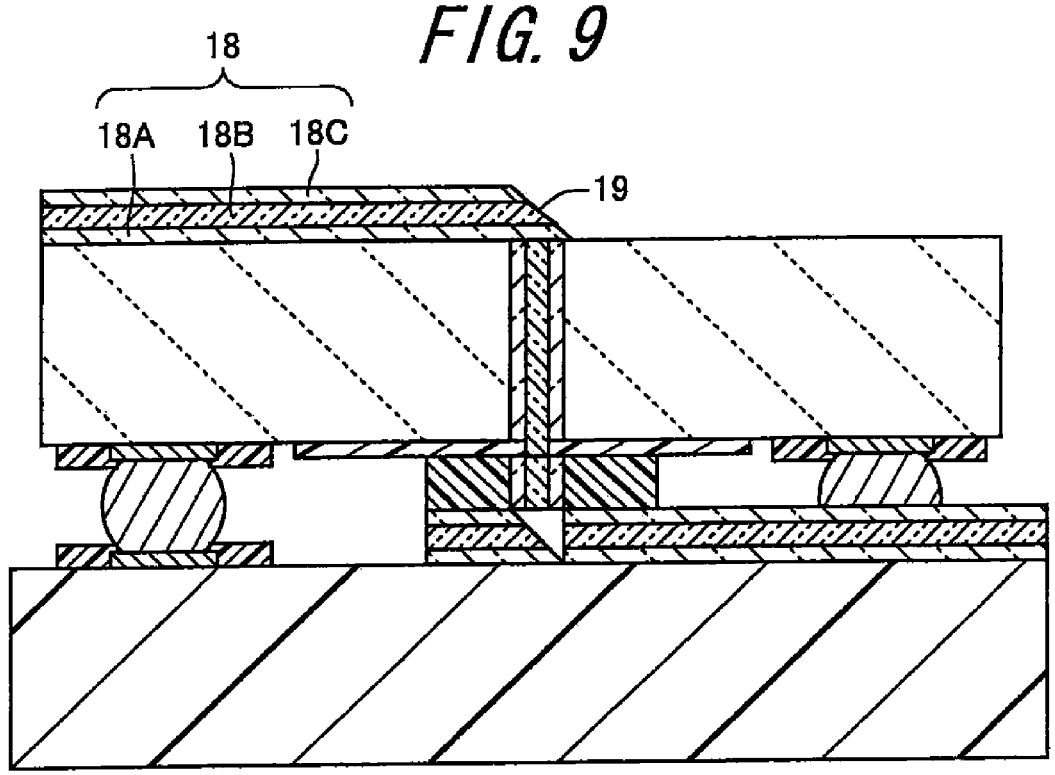
FIG. 9 is a sectional view of the integrated optical transmission board as viewed in a direction perpendicular to FIG. 8.

Next, an integrated optical transmission board having a structure different from that of the integrated optical transmission board shown in FIG. 1 will be described. As shown in FIGS. 8 and 9, on a main surface of the semiconductor package 10 opposite to the main surface thereof facing the second substrate 16, there is disposed an optical waveguide 18 which extends in parallel with the main surface and is optically connected to the second optical transmission line 14. The second optical transmission line 14 and the optical waveguide 18 are so arranged as to make a 90-degree change in optical axis with respect to a turning mirror 19. In a case where the optical semiconductor device mounted on the semiconductor package 10 is of the edge-type in which light is taken in and out at each end face, it is desirable to adopt such a construction, viz., a construction having the optical waveguide 18 for allowing light to propagate in parallel with the main surface of the semiconductor package 10. Moreover, also in a case where a plurality of semiconductor packages 10 are stacked together, a construction such as the present embodiment is desirable.

Figure 10:
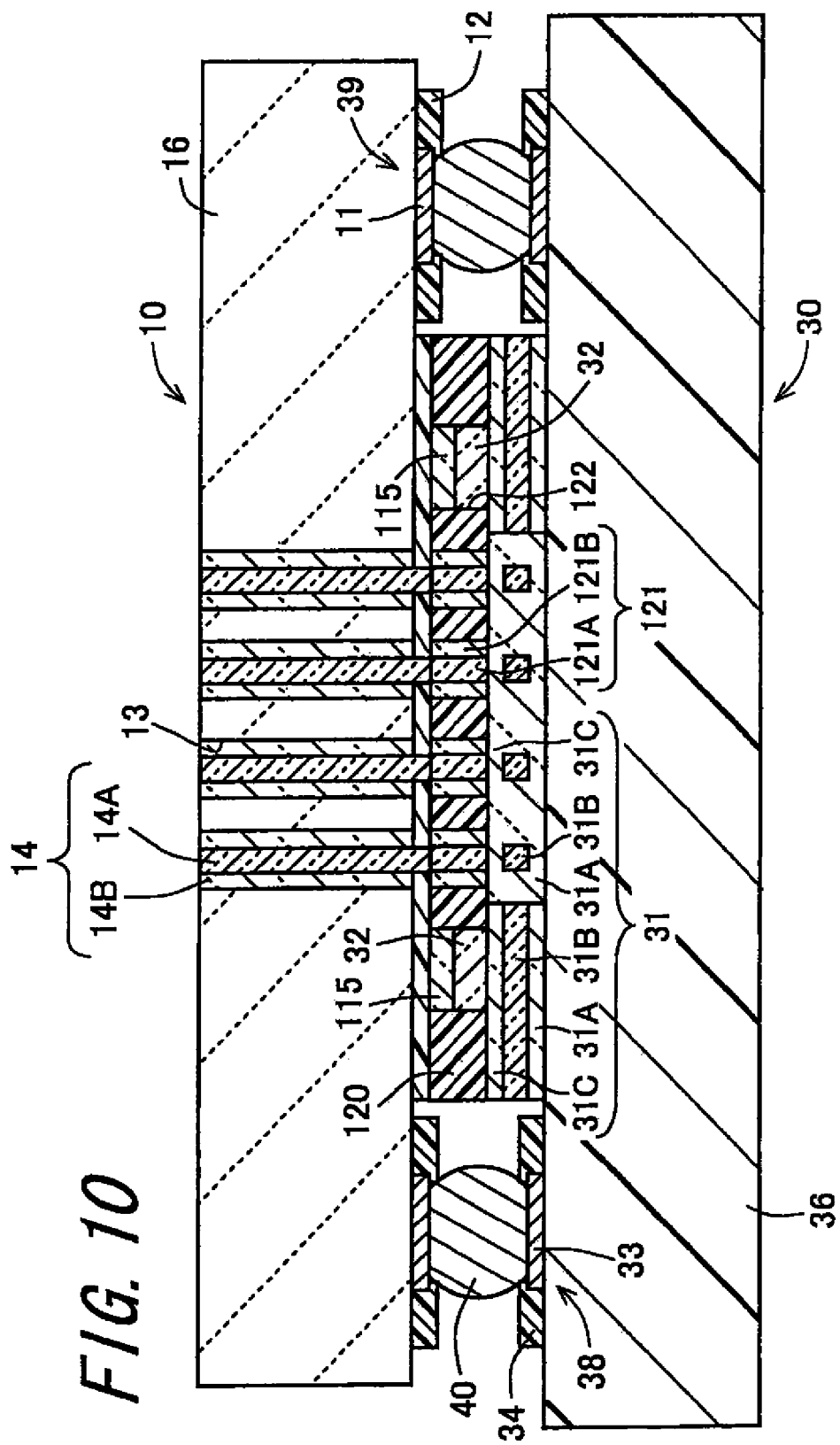
FIG. 10 is a sectional view showing the structure of the integrated optical transmission board in accordance with a third embodiment of the invention.
Figure 11:
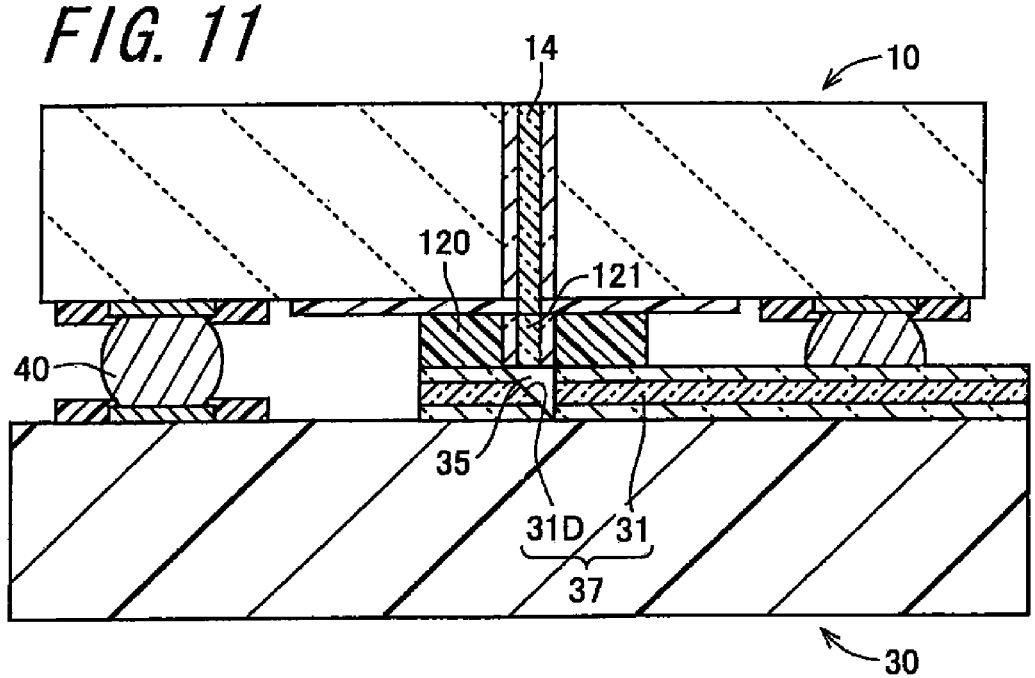
FIG. 11 is a sectional view of the integrated optical transmission board as viewed in a direction perpendicular to FIG. 10.
Figure 12:
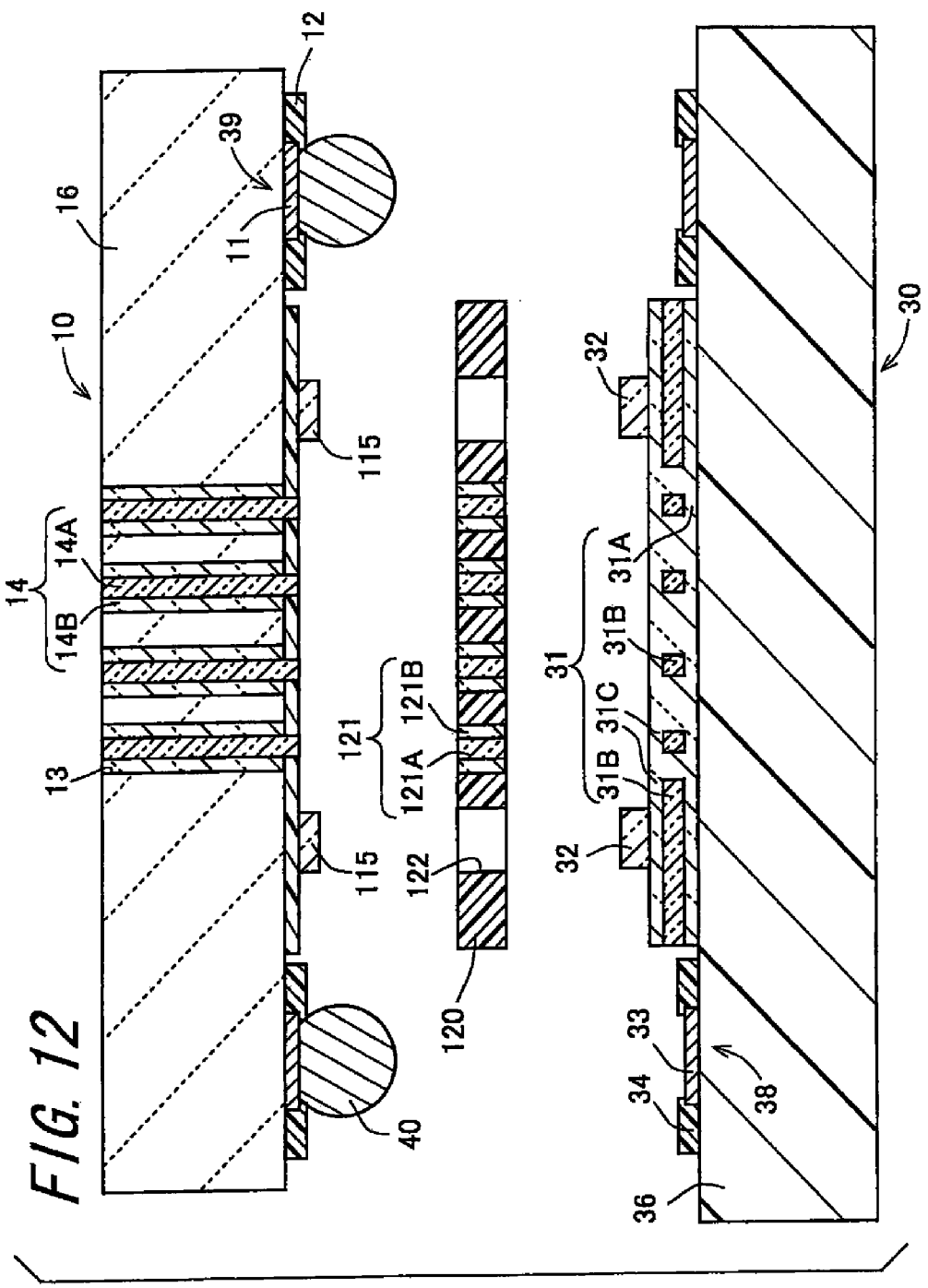
FIG. 12 is an exploded sectional view of the integrated optical transmission board as viewed in the same direction as FIG. 10.

As shown in FIGS. 10 to 12, the integrated optical transmission board in accordance with a third embodiment of the invention is constructed by stacking a semiconductor package 10 acting as the second optical transmission board, an optical coupling structure 120, and a circuit board 30 acting as the first optical transmission board successively in the order named for mutual optical connection.

The integrated optical transmission board in accordance with the third embodiment of the invention shown in FIGS. 10 to 12 comprises the circuit board 30 acting as the first optical transmission board, the semiconductor package 10 acting as the second optical transmission board, and the optical coupling structure 120. The optical coupling structure 120 is similar in workings to the optical coupling structure of the integrated optical transmission board in accordance with the first and second embodiment of the invention. Note that the integrated optical transmission board of the third embodiment of the invention differs from the integrated optical transmission board of the first and second embodiments of the invention in that the second optical transmission board is provided with a third engagement portion and the optical coupling structure is provided with a fourth engagement portion in which the third engagement portion engages.

The circuit board 30 is similar in structure to the circuit board 30 of the integrated optical transmission board of the first embodiment of the invention, and will therefore not be described in detail.

Also, the semiconductor package 10 is similar in structure to the semiconductor package 10A of the integrated optical transmission board of the second embodiment of the invention, and will therefore not be described in detail.

Note that the semiconductor package 10 has a second projection 115 acting as the third engagement portion provided in an area thereof opposed to the optical coupling structure 120. Moreover, the first projection 32 and the second projection 115 are arranged face to face with each other.

The optical coupling structure 120 has the second engagement portion and the fourth engagement portion. In FIGS. 10 to 12, as the second engagement portion, there is shown a through hole 122 which merges with the fourth engagement portion. However, the second engagement portion of the invention is not so limited but may be of another configuration so long as it is engageable with the first engagement portion 32. Therefore, for example, the second engagement portion may be formed as a concavity having a bottom surface instead of a through hole. Similarly, the fourth engagement portion may be of any given configuration so long as it is engageable with the third engagement portion 115. Therefore, for example, the fourth engagement portion may be formed as a concavity having a bottom surface instead of a through hole.

Note that, in the case where the first projection 32 acting as the first engagement portion and the second projection 115 acting as the third engagement portion take on the form of a projection, by designing a plurality of the second and fourth engagement portions provided in the optical coupling structure 120 in the form of a through hole, it is possible to facilitate the manufacture of the optical coupling structure 120 and thereby reduce the manufacturing cost.

The integrated optical transmission board of the third embodiment of the invention is so designed that a third optical transmission line 121 is optically connected to the second optical transmission line 14 and the first optical transmission line 37 under the condition that the first engagement portion engages in the second engagement portion and the third engagement portion engages in the fourth engagement portion.

In this way, the first engagement portion and the second engagement portion engage each other with great precision, and the third engagement portion and the fourth engagement portion engage each other with great precision as well. This makes it possible to prevent a misalignment from occurring between the semiconductor package 10 and the circuit board 30 through the optical coupling structure 120 in respect of their horizontal optical connection.

Just as is the case with the optical coupling structure 20 in the integrated optical transmission board of the first and second embodiments of the invention, except for the area formed with the third optical transmission line 121, the optical coupling structure 120 is made of a material having shading properties.

In the integrated optical transmission board shown in FIGS. 10 to 12, the heights of, respectively, the second projection 115 and the first projection 32 are correlated with the length of the through hole 122, viz., the thickness of the optical coupling structure 120, and the height of the solder ball 40. For example, it is ensured that the sum of the height of the second projection 115 and the height of the first projection 32 will be equal to or smaller than the thickness of the optical coupling structure 120.

The semiconductor package 10 and the circuit board 30, while being optically connected together through the optical coupling structure 120 as described hereinabove, are electrically connected together by establishing connection between the opposed connection pads of the semiconductor package and the circuit board through a plurality of mounting portions 40 such as solder balls or solder bumps.

In the integrated optical transmission board of the third embodiment of the invention, the optical coupling structure having the third optical transmission line is present in the gap between the first optical transmission board and the second optical transmission board. Therefore, just as in the case of the optical transmission board of the first and second embodiments, it is possible to reduce the possibility that a flux will cover the exposed surface of the first optical transmission line and the exposed surface of the second optical transmission line as well, and thereby prevent deterioration in optical transmission performance.

The part of optical connection between the first optical transmission line 37 and the third optical transmission line 121 and the part of optical connection between the second optical transmission line 14 and the third optical transmission line 121 are located centrally of the integrated optical transmission board. The mounting portions 40 are so arranged as to surround the outer periphery of the optical coupling structure 120, for allowing the semiconductor package 10 and the circuit board 30 to be directly and fixedly bonded to each other without the involvement of the optical coupling structure 120.

The integrated optical transmission board thus far described is formed by joining together the semiconductor package 10, the optical coupling structure 120 which is a flat plate-shaped component, and the circuit board 30 through the following procedural steps.

(a) The solder balls 40 having a desired diameter are attached to the semiconductor package 10 under application of heat. At this time, a solder paste is printed to connection pads with use of a mask bearing holes of the same pitch as that of the connection pads, and solder balls are arranged thereon, followed by heating them up to a temperature higher than or equal to the melting temperature of the solder ball.

(b) The optical coupling structure 120 is emplaced on the circuit board 30, and the first projection 32 is fitted in the through hole 122. At this time, in the gap between the circuit board 30 and the optical coupling structure 120, a very small amount of a refractive-index matching agent is added. As the refractive-index matching agent, silicone resin, epoxy resin, acrylic resin, or the like having a refractive index close to that of the core of the optical through hole is suitable for use.

(c) The semiconductor package 10 is laid on the optical coupling structure 120, and the second projection 115 is fitted in the through hole 122. At this time, in the gap between the optical coupling structure 120 and the semiconductor package 10, a very small amount of a refractive-index matching agent is added.

(d) The assembly thereby obtained is heated in a reflow furnace or the like. The solder ball 40 is originally made largish in diameter with consideration given to its post-melting state. That is, at a temperature lower than the melting point of the solder ball, a gap still exists between the optical coupling structure 120 and the semiconductor package 10. Then, by the same effect as that occurs in the circuit board, the semiconductor package, and the solder ball in the integrated optical transmission board of the preceding first embodiment, the size of the gap is reduced.

In this way, an optical coupling structure ranging from the second optical transmission line 14 to the first optical transmission line 37 via the third optical transmission line 121 is completed.

Note that, when the assembly is heated in a reflow furnace or the like, a load may be placed at the side of the semiconductor package 10. This is effective as a method to reduce the size of the gap in the part of optical connection between the first optical transmission line 37 and the third optical transmission line 121, as well as the part of optical connection between the second optical transmission line 14 and the third optical transmission line 121.

Figure 13:
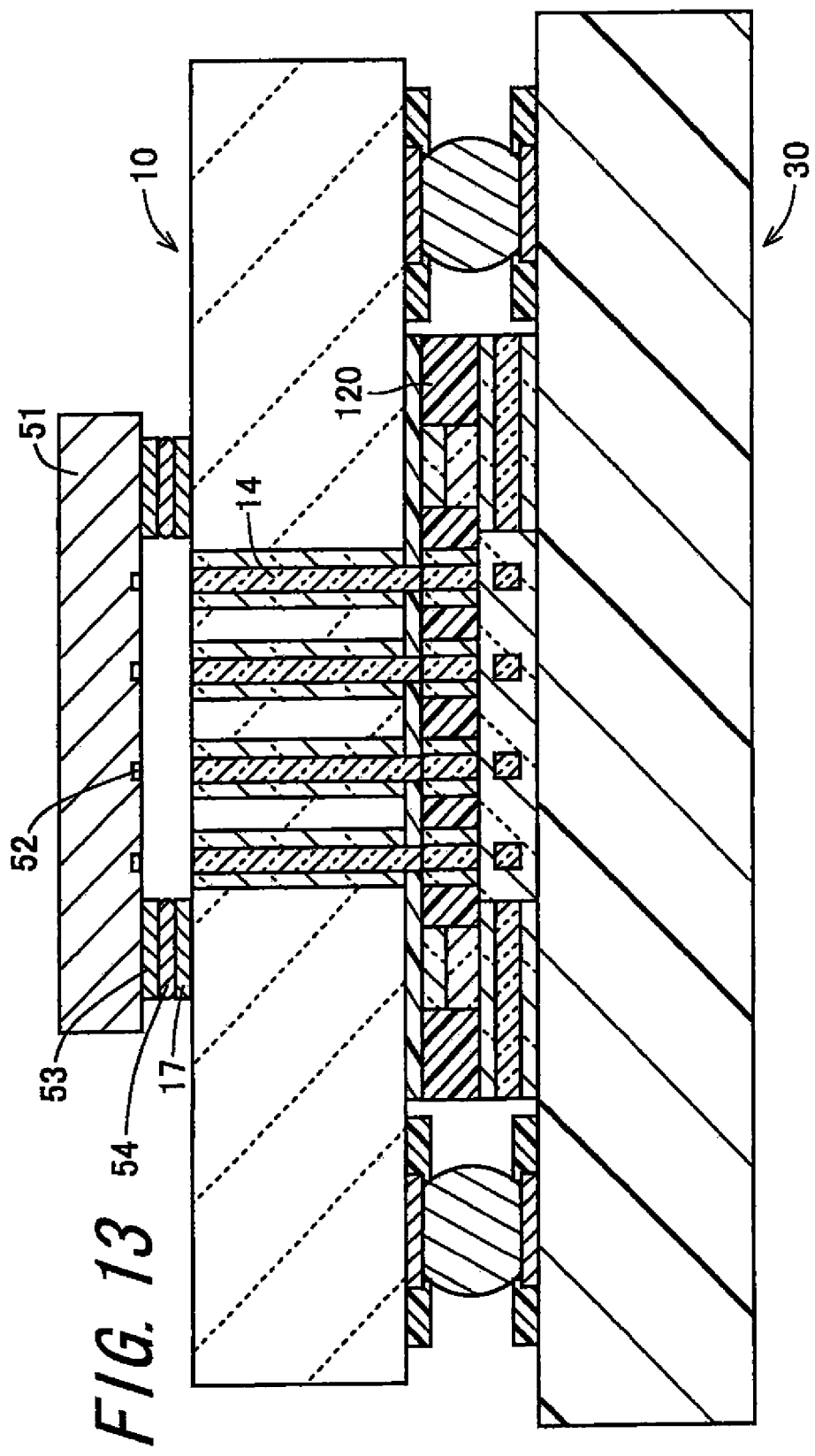
FIG. 13 is a sectional view showing the structure of an optical module.

In FIG. 13, there is shown an optical module constructed by mounting a semiconductor laser array 51 on the integrated optical transmission board of the third embodiment of the invention. Note that the semiconductor laser array 51 is similar to the above-described semiconductor laser array shown in FIG. 7 and will therefore not be described in detail.

Figure 14:
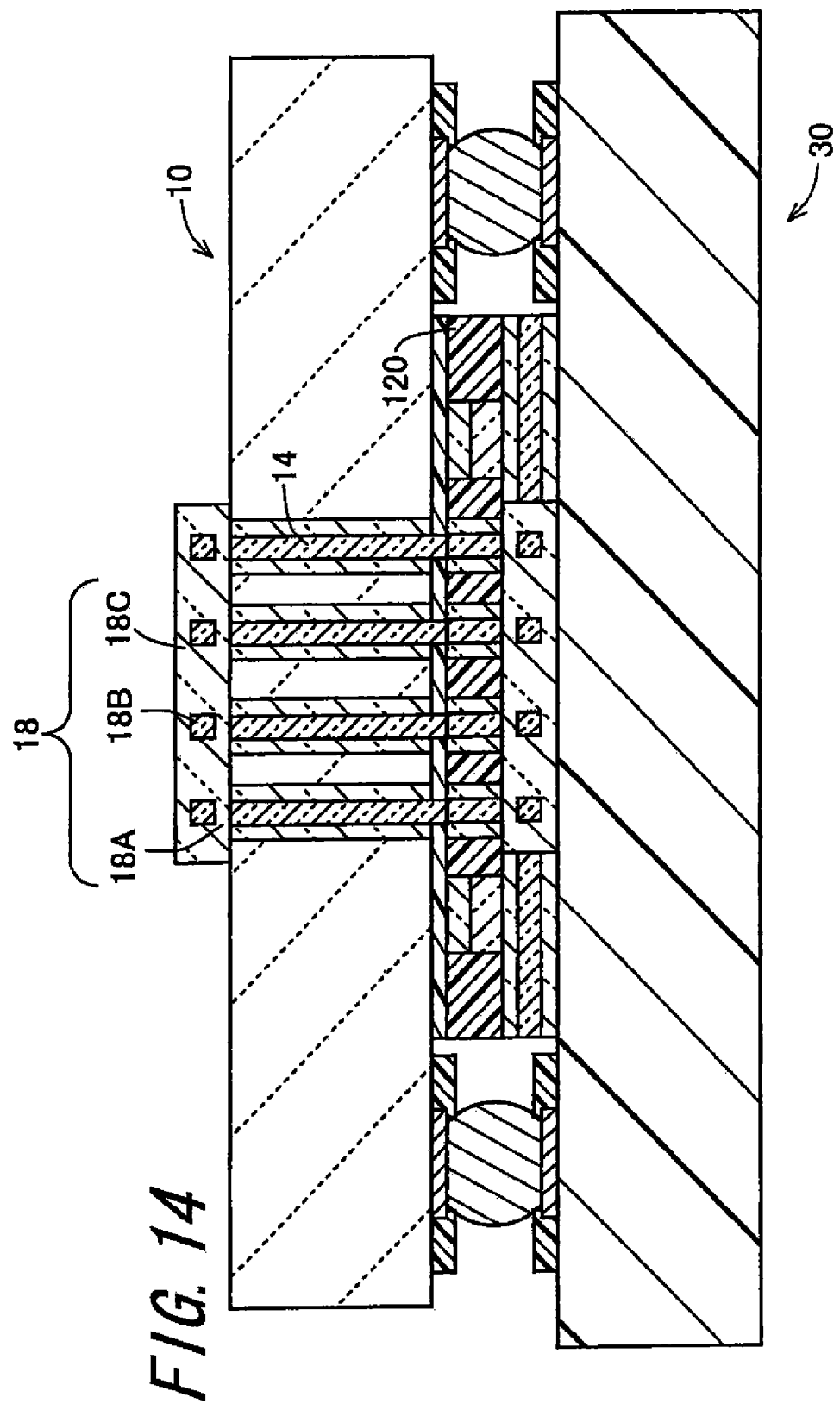
FIG. 14 is a sectional view showing a different structure of the integrated optical transmission board in accordance with the third embodiment of the invention, from that of the integrated optical transmission board shown in FIG. 10.
Figure 15:
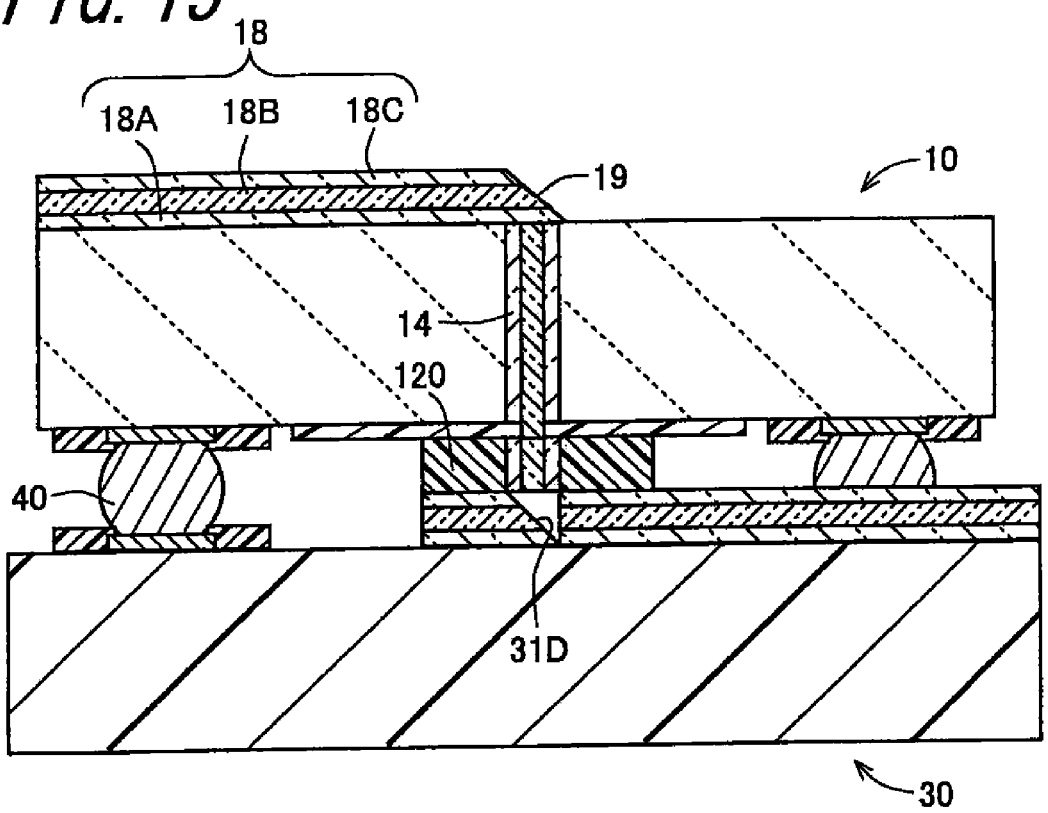
FIG. 15 is a sectional view of the integrated optical transmission board as viewed in a direction perpendicular to FIG. 14.

The integrated optical transmission board shown in FIGS. 14 and 15 is the integrated optical transmission board of the third embodiment of the invention in which, on the main surface of the semiconductor package 10 opposite to the main surface thereof facing the second substrate 16, there is disposed the optical waveguide 18 which extends in parallel with the main surface and is optically connected to the second optical transmission line 14. Note that the optical waveguide 18 shown in FIGS. 14 and 15 is similar to the optical waveguide shown in FIGS. 8 and 9 and will therefore not be described in detail.

Hereinafter, a method of forming the third optical transmission line 121 of the optical coupling structure 120 will be described.

(a) In a plate-like member having shading properties, two types of through holes, namely large-diameter through holes and small-diameter through holes, are provided so as to pass therethrough in a thickness direction thereof. The large-diameter through hole acts as a positioning through hole 122 in which the projection 115 and the projection 32 engage. The small-diameter through hole acts as a through hole for forming the third optical transmission line 121 through the following procedural steps.

(b) A cladding material made of transparent resin, for example, transparent epoxy resin having a refractive index of approximately 1.5 is charged into the small-diameter through hole, followed by causing it to be cured under application of heat.

(c) A through hole is created at the center of the cladding material charged in the through hole by using a precise drill or laser.

(d) A material, for example, transparent epoxy resin, which is a few or more percent higher in specific refractive index than the cladding material is charged evenly into the through hole created centrally of the cladding material, followed by causing it to be cured under application of heat.

(e) Both of the main surfaces of the member are polished to impart surface flatness to the third optical transmission line 121.

Through the procedural steps thus far described, the optical coupling structure 120 is fabricated.

Note that, as an alternative to the above-described forming method, two types of through holes, namely large-diameter through holes and small-diameter through holes, are provided in a block-like component, and optical fiber is inserted into and bonded to the small-diameter through hole. Then, the component is subjected to slicing process in accordance with a desired thickness.

Figure 16:
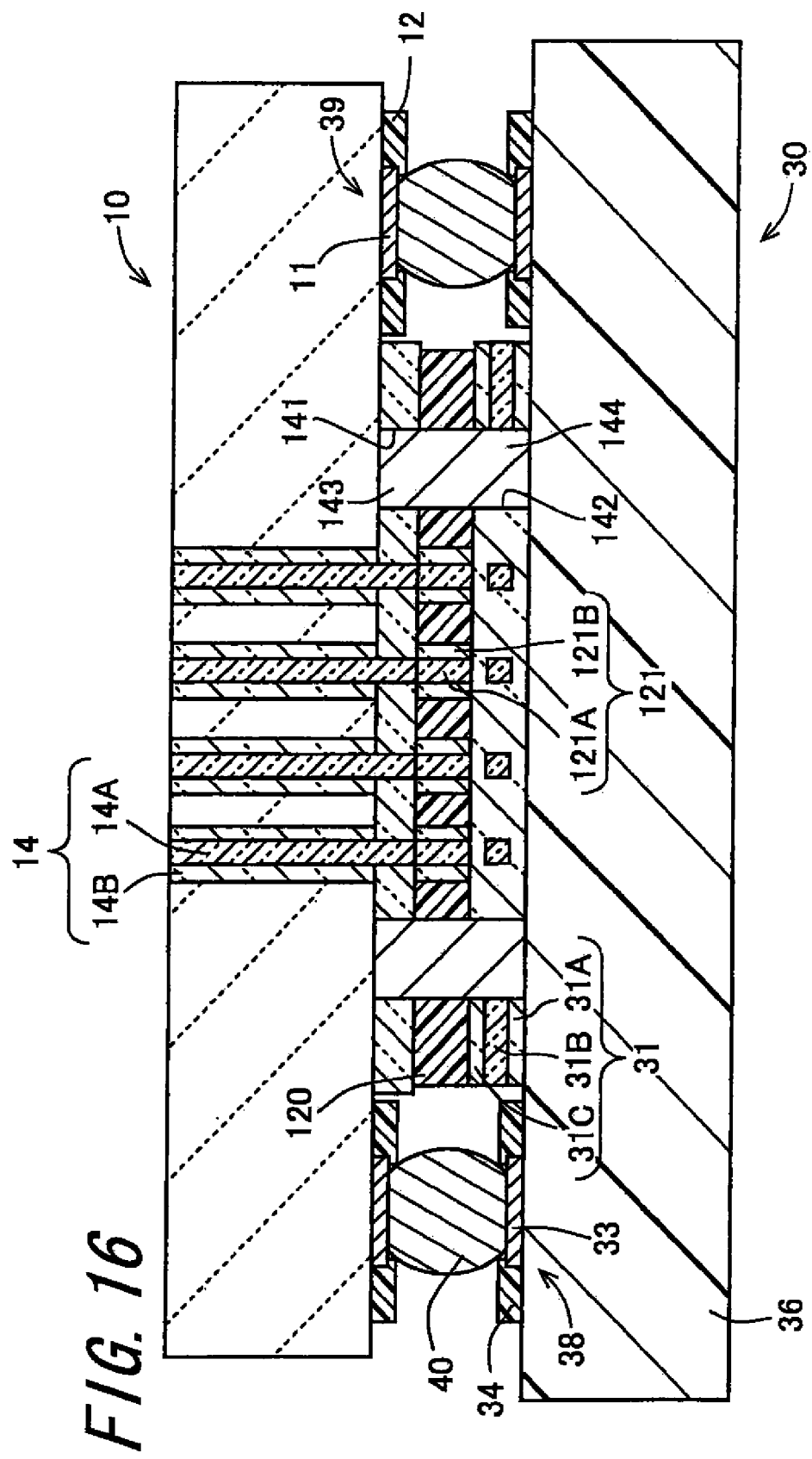
FIG. 16 is a sectional view showing the structure of the integrated optical transmission board in accordance with a forth embodiment of the invention.
Figure 17:
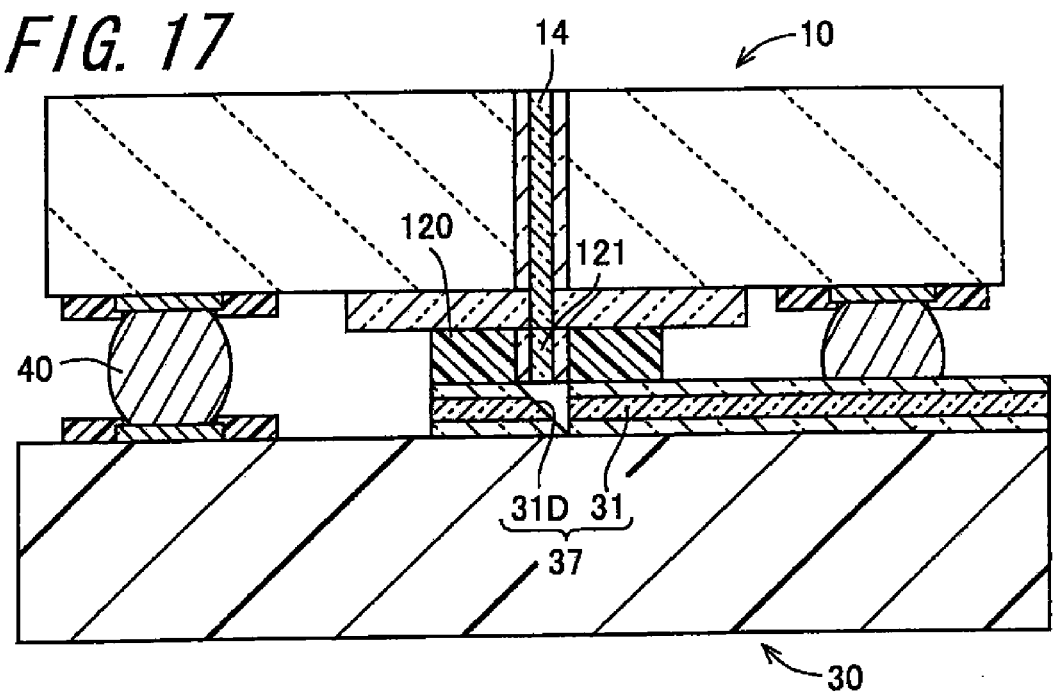
FIG. 17 is a sectional view of the integrated optical transmission board as viewed in a direction perpendicular to FIG. 16.
Figure 18:
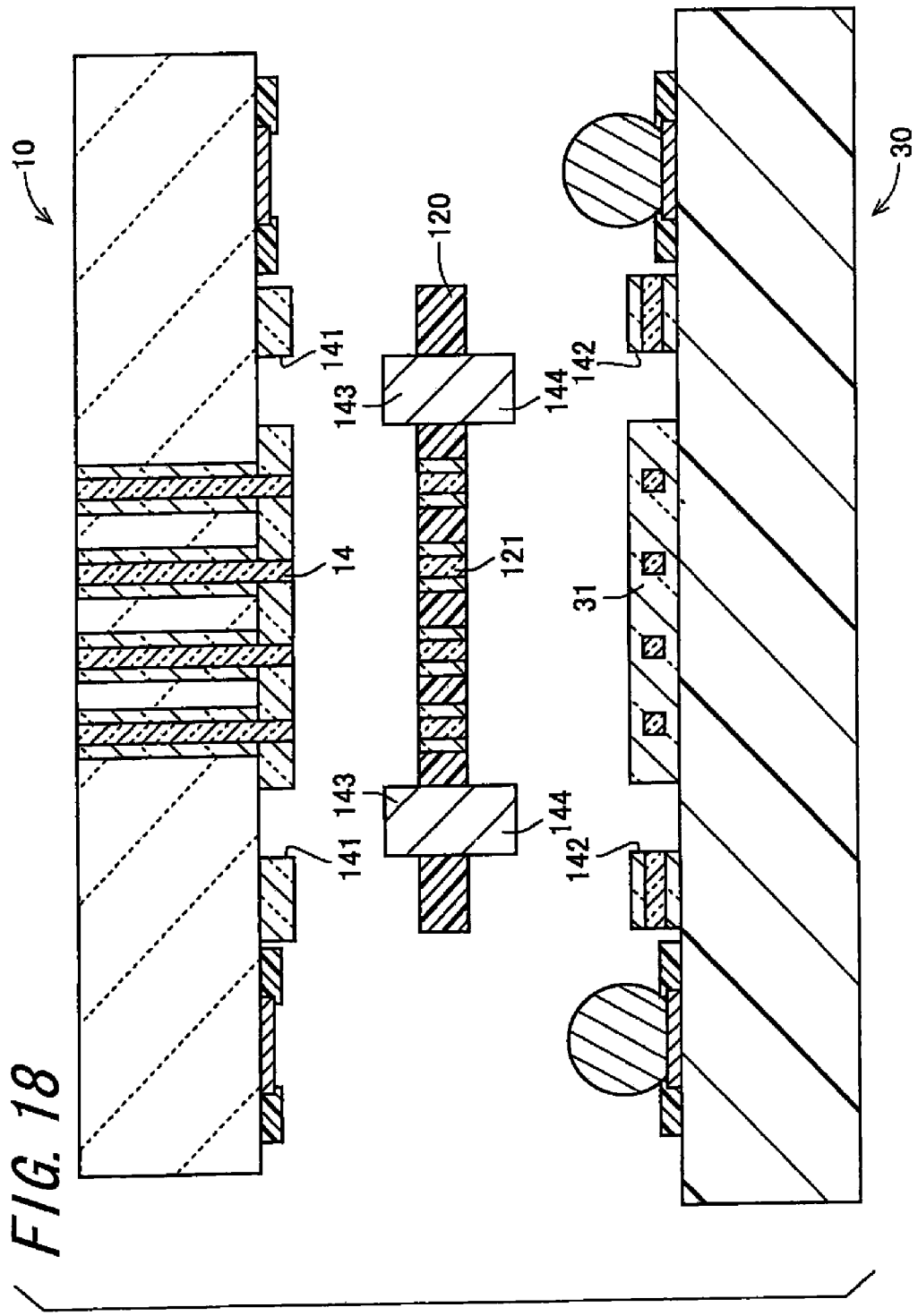
FIG. 18 is an exploded sectional view of the integrated optical transmission board as viewed in the same direction as FIG. 16.

In FIGS. 16 to 18, there is shown the integrated optical transmission board in accordance with a fourth embodiment of the invention.

Note that the integrated optical transmission board of the fourth embodiment differs from the integrated optical transmission board of the third embodiment in that the first engagement portion is a concavity 142, the third engagement portion is a concavity 141, the second engagement portion is a projection 144, and the fourth engagement portion is a projection 143. Otherwise, the integrated optical transmission board of the fourth embodiment is similar in structure to that of the third embodiment.

Note that, in FIGS. 16 to 18, the projection 144 acting as the second engagement portion and the projection 143 acting as the fourth engagement portion are formed by inserting an insertion pin whose length is greater than the thickness of the optical coupling structure 120 into the large-diameter through hole.

Preferably the opening of the concavity 141, 142 is circular in shape, and examples of shape of the projection 143, 144 include a columnar shape, a forwardly tapered shape (tapered structure), and an inversely tapered shape (club-shaped structure).

Figure 19A:
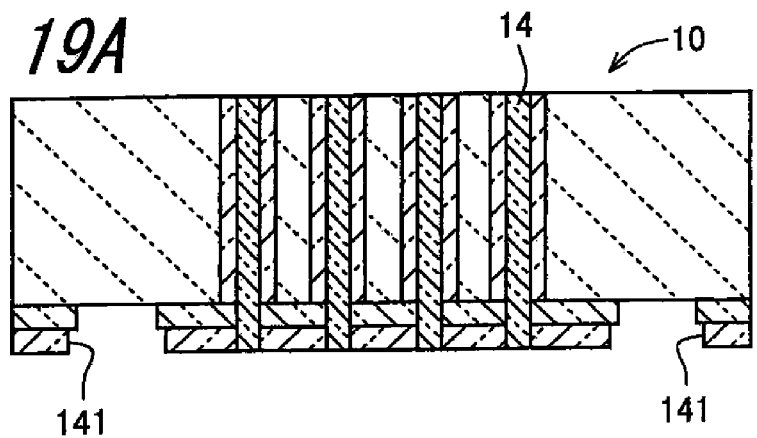
FIG. 19A is a partial sectional view of the integrated optical transmission board in accordance with the fourth embodiment of the invention.
Figure 19B:
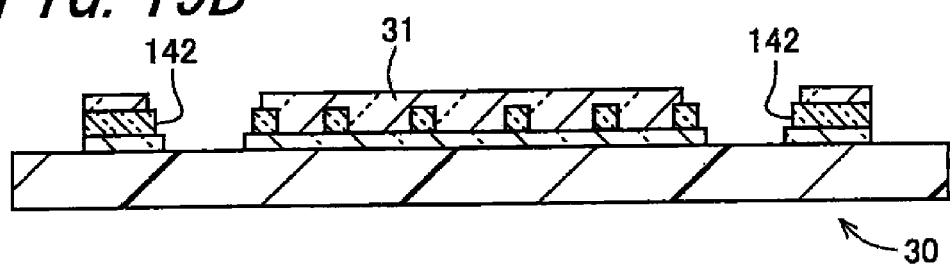
FIG. 19B is a partial sectional view of the integrated optical transmission board in accordance with the fourth embodiment of the invention.

In FIGS. 19A and 19B, the concavity 141 of the semiconductor package 10 and the concavity 142 of the circuit board 30 are each so shaped as to vary in diameter from part to part along a thickness direction thereof. It is preferable that each of the concavities is so shaped that its diameter becomes larger gradually from the inner part to the outer part.

As shown in FIG. 19A, the concavity 141 of the semiconductor package 10 is formed in a conical shape which is obtained by adopting a two-layer structure, for example. By virtue of the two-layer structure, not only it is possible to attain a concavity 141 having an adequate thickness (i.e., depth) that cannot be obtained in the case of a one-layer structure, but it is also possible to ensure smooth engagement.

As shown in FIG. 19B, the concavity 142 may be stepped in conformity with the individual layers constituting the optical waveguide 31 of the first optical transmission line 37. This is effective in facilitating the engagement of the projection 144. In this case, the concavity 142 is so shaped that its opening diameter is gradually increased in little increments from the part corresponding to the lower layer, viz., the lower cladding 31A to the part corresponding to the upper layer, viz., the upper cladding 31C through the part corresponding to the core 31B. In this way, a conically-shaped concavity 142 can be obtained. Since the opening diameter corresponding to the lower cladding 31A is set to be equal to the diameter of the projection 144, it follows that the projection 144 can be fitted easily by virtue of the conically-shaped concavity 142 while achieving highly accurate positioning, with consequent even smoother engagement.

The concavity 142 of the circuit board 30 can be designed to have a greater depth on an as needed basis to ensure further engagement stability. The dimension of the core 31B of the optical waveguide 31 of the first optical transmission line 37 is determined according to optical line design. Therefore, the depth of the concavity 142 can be adjusted by increasing the thickness of the lower cladding 31A as well as the upper cladding 31C.

Figure 19C:
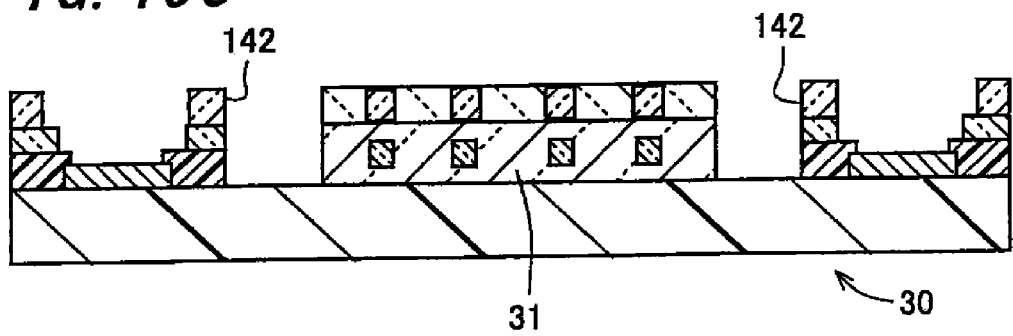
FIG. 19C is a partial sectional view of the integrated optical transmission board in accordance with the fourth embodiment of the invention.

Moreover, the depth can be increased by forming a photosensitive-resin pattern above the optical waveguide 31. In a case where the depth is increased to a large extent, to avoid adverse effects such as warpage of the substrate, it is desirable to form a resin layer in a minute area constituting the concavity 142. In this case, as shown in FIG. 19C, through application of photosensitive resin, pre-baking, light exposure using a mask, development, and post-baking, an additional concavity is formed above the concavity 142 formed on the optical waveguide 31.

Figure 20:
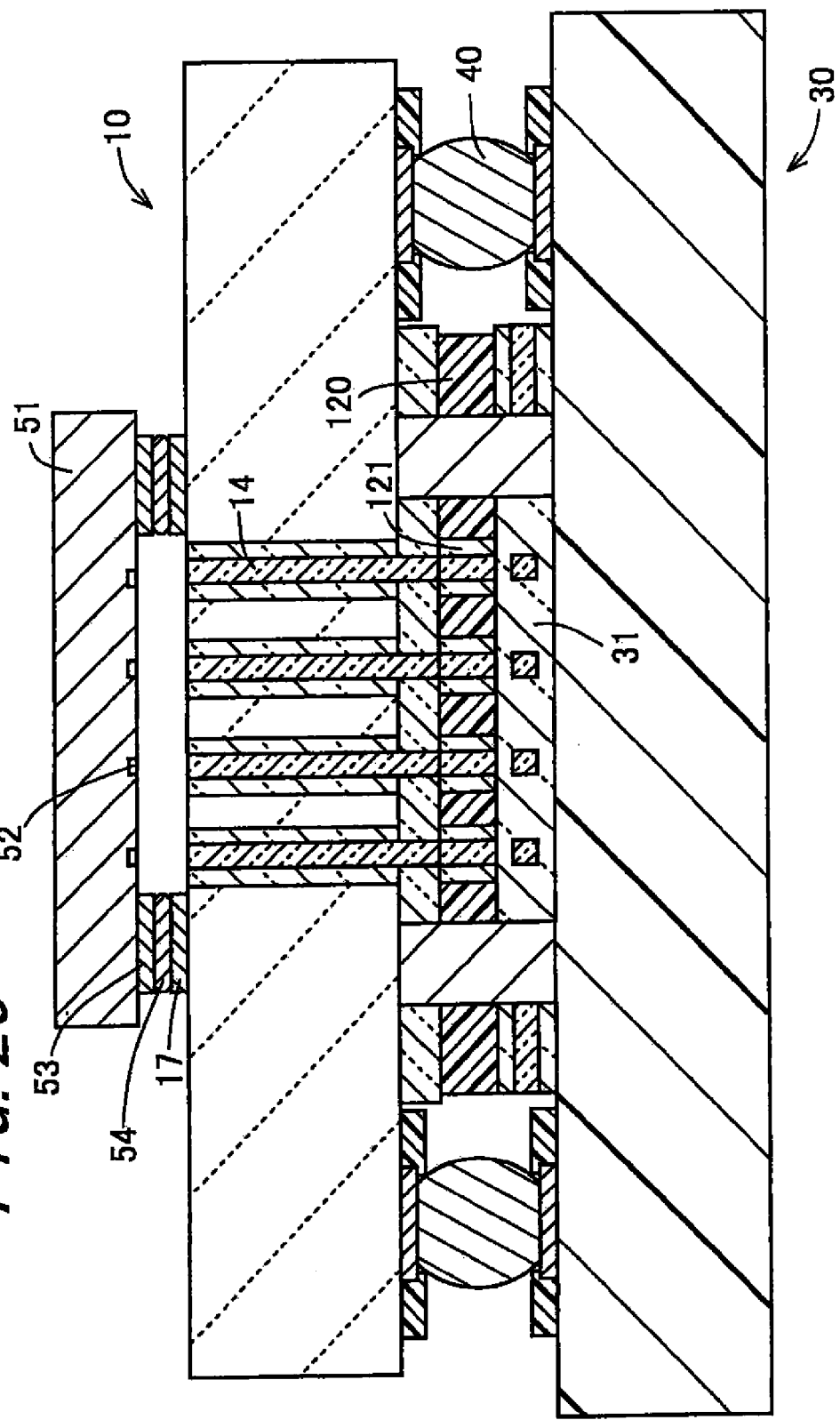
FIG. 20 is a sectional view showing the structure of an optical module.

In FIG. 20, there is shown an optical module constructed by mounting, as an optical semiconductor device, a semiconductor laser array 51 on the integrated optical transmission board shown in FIG. 16. Note that the semiconductor laser array 51 is similar to the above-described semiconductor laser array shown in FIGS. 7 and 13, and will therefore not be described in detail.

Figure 21:
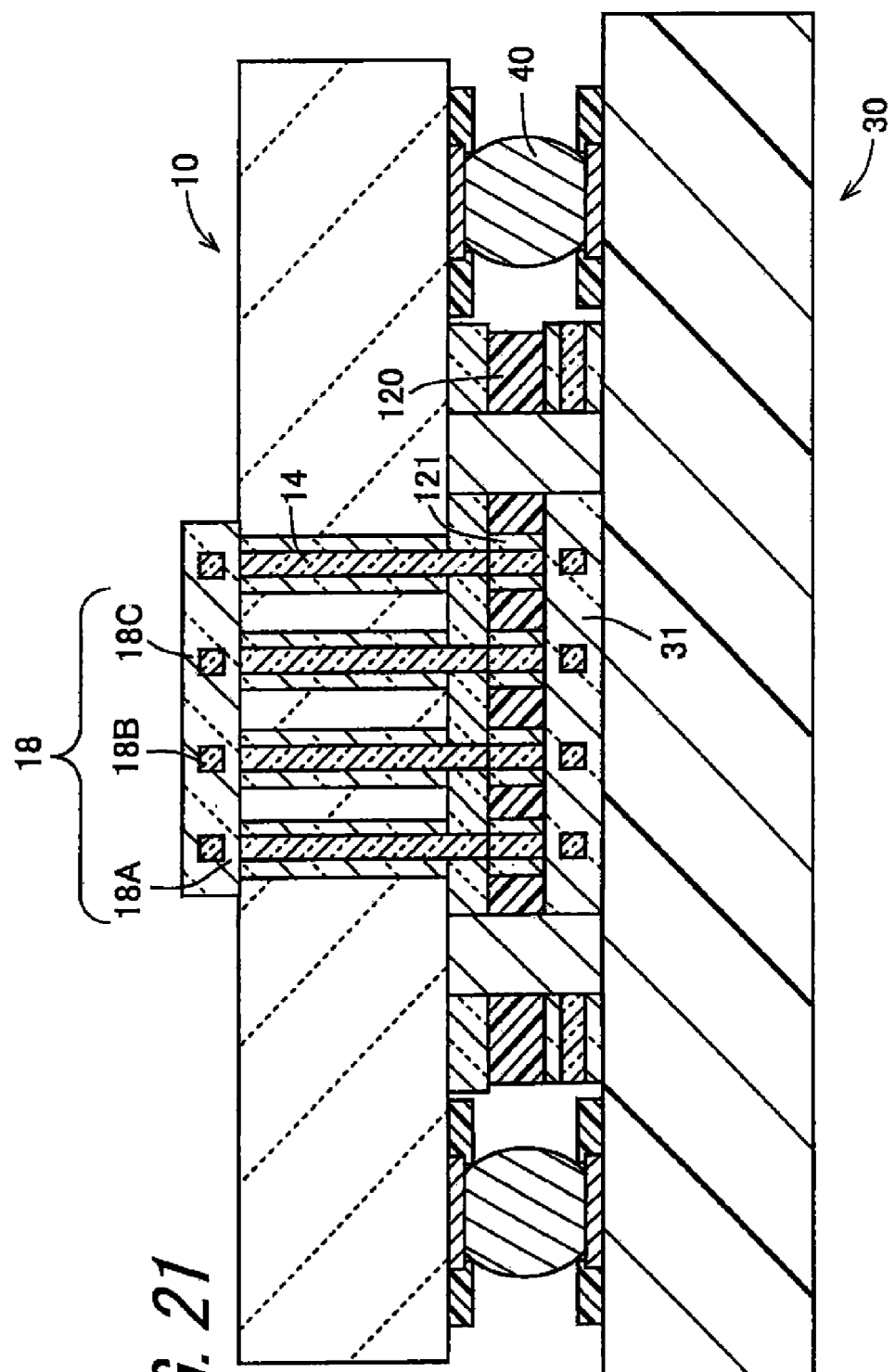
FIG. 21 is a sectional view showing a different structure of the integrated optical transmission board in accordance with the fourth embodiment of the invention, from that of the integrated optical transmission board shown in FIG. 16.
Figure 22:
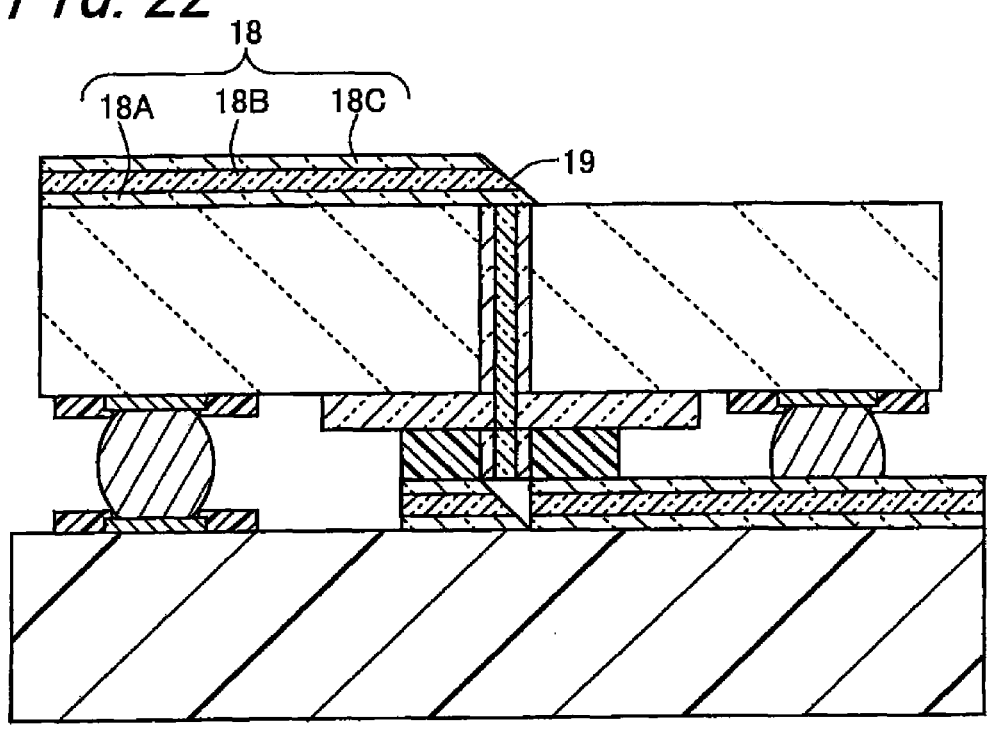
FIG. 22 is a sectional view of the integrated optical transmission board as viewed in a direction perpendicular to FIG. 21.

The integrated optical transmission board shown in FIGS. 21 and 22 is the integrated optical transmission board of the fourth embodiment of the invention in which, on the main surface of the semiconductor package 10 opposite to the main surface thereof facing the second substrate 16, there is disposed the optical waveguide 18 which extends in parallel with the main surface and is optically connected to the second optical transmission line 14. Note that the optical waveguide 18 shown in FIGS. 21 and 22 is similar to the optical waveguide shown in FIGS. 14 and 15 and will therefore not be described in detail.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. An integrated optical transmission board, comprising:
    a first optical transmission board comprising a first optical transmission line;
    a second optical transmission board comprising a second optical transmission line;
    an optical coupling structure which is disposed between the first optical transmission board and the second optical transmission board, and comprises a third optical transmission line configured to connect optically between the first optical transmission line and the second optical transmission line;
    a plurality of mounting portions which are interposed between the first optical transmission board and the second optical transmission board, and configured to connect fixedly the first optical transmission board and the second optical transmission board outside the optical coupling structure, wherein
    the first optical transmission board further comprises a first engagement portion comprising one of a projection and a cavity in an area thereof opposing to the optical coupling structure,
    the optical coupling structure further comprises a second engagement portion comprising one of a projection and a cavity, the second engagement portion being in an area thereof opposing to the first optical transmission board and is configured to engage with the first engagement portion, and
    the first engagement portion and the second engagement portion have a combination of a projection and a cavity.

2. The integrated optical transmission board according to claim 1,
    wherein the first optical transmission line comprises an optical waveguide, and a turning face inclined with respect to a direction of an optical axis of the optical waveguide,
    the second optical transmission board further comprises a second substrate through which the second optical transmission line passes in a thickness direction thereof, and
    the third optical transmission line passes through the optical coupling structure in a thickness direction thereof.

3. The integrated optical transmission board according to claim 2, wherein the third optical transmission line is formed continuously and integrally with the second optical transmission line.

4. The integrated optical transmission board according to claim 1, wherein the optical coupling structure is made of a material having shading properties, except for an area thereof formed with the third optical transmission line.

5. The integrated optical transmission board according to claim 1, wherein the second optical transmission board further comprises a third engagement portion in an area thereof opposing to the optical coupling structure, and
    the optical coupling structure further comprises a fourth engagement portion in an area thereof opposing to the second optical transmission board, the fourth engagement portion engaging the third engagement portion.

6. The integrated optical transmission board according to claim 5, wherein the first engagement portion and the third engagement portion are configured to be projections facing each other, and
    the second engagement portion and the fourth engagement portion are configured to be an integrated through hole through which the optical coupling structure passes.

7. The integrated optical transmission board according to claim 5, wherein the first engagement portion and the third engagement portion are configured to be concavities facing each other, and
    the second engagement portion and the fourth engagement portion are configured to be projections.

8. An optical module, comprising:
    the integrated optical transmission board according to claim 1; and
    an optical semiconductor device which is optically connected to the first optical transmission line, and is mounted on one main surface of the second optical transmission board, the one main surface being opposite to the other main surface which faces the first optical transmission board.

9. An optical module, comprising:
    the integrated optical transmission board according to claim 5; and
    an optical semiconductor device which is optically connected to the second optical transmission line, and is mounted on the second optical transmission board so as to face the optical coupling structure through the second optical transmission board.

10. An optical transmission structure, comprising:
    an optical transmission board comprising an optical transmission line for optical transmission;
    an optical coupling structure which is on the optical transmission board, and comprises another optical transmission line to be optically connected to the optical transmission line and an engagement portion for engagement with another member; and
    a plurality of mounting portions which is on the optical transmission board and located outside the optical coupling structure,
    the engagement portion having a projection or a cavity.

* * * * *